(12) United States Patent
Tsuchi

(10) Patent No.: US 7,545,305 B2
(45) Date of Patent: Jun. 9, 2009

(54) DATA DRIVER AND DISPLAY DEVICE

(75) Inventor: Hiroshi Tsuchi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/979,342

(22) Filed: Nov. 1, 2007

(65) Prior Publication Data
US 2008/0174462 A1  Jul. 24, 2008

(51) Int. Cl.
H03M 1/66 (2006.01)
(52) U.S. Cl. .......................... 341/144; 330/255
(58) Field of Classification Search ............ 341/144, 341/155, 150; 330/255, 261
See application file for complete search history.

(56) References Cited

U.S. PATENT DOCUMENTS

| 4,570,128 | A | | 2/1986 | Monticelli |
| 4,764,752 | A | * | 8/1988 | Ormond ................. 341/167 |
| 7,170,351 | B2 | | 1/2007 | Shimatani |
| 7,369,816 | B2 | * | 5/2008 | Kappes et al. ............. 455/73 |

FOREIGN PATENT DOCUMENTS

| JP | 6-91379 | 11/1994 |
| JP | 10-153986 | 6/1998 |
| JP | 11-223807 | 8/1999 |
| JP | 11-305735 | 11/1999 |
| JP | 2002-175052 | 6/2002 |
| JP | 2005-124120 | 5/2005 |
| JP | 2005-328464 | 11/2005 |
| JP | 2006-106657 | 4/2006 |
| JP | 2006-154772 | 6/2006 |
| JP | 2006-197532 | 7/2006 |

OTHER PUBLICATIONS

Japanese Office Action dated Oct. 14, 2008 with Partial English-Language Translation.

* cited by examiner

Primary Examiner—Peguy JeanPierre
(74) Attorney, Agent, or Firm—McGinn IP Law Group, PLLC

(57) ABSTRACT

A data driver includes a positive-polarity reference voltage generation circuit that outputs positive-polarity reference voltages, a positive-polarity decoder that receives the positive-polarity reference voltages from the positive-polarity reference voltage generation circuit, end selects and outputs at least one positive-polarity reference voltage in accordance with first digital data, a positive-polarity amplifier which includes a first differential units that receives the selected reference voltage selected by the positive-polarity decoder, performs amplification, and outputs a voltage to a first amplifier output terminal, δ negative-polarity reference voltage generation circuit that outputs negative-polarity reference voltages, and a negative-polarity decoder that receives the negative-polarity reference voltages from the negative-polarity reference voltage generation circuit, and selects and outputs at least one negative-polarity reference voltage in accordance with second digital data.

15 Claims, 8 Drawing Sheets

DATA DRIVER AND DISPLAY DEVICE

REFERENCE TO RELATED APPLICATION

This application is based upon and claims the benefit of the priority of Japanese patent application No. 2006-299247, filed on Nov. 2, 2006, the disclosure of which is incorporated herein in its entirety by reference thereto.

FIELD OF THE INVENTION

The present invention relates to a data driver and a display device using the data driver.

BACKGROUND OF THE INVENTION

Recently, a demand for liquid crystal display devices for use in large-screen liquid crystal display (LCD) TV sets as well as for use in portable telephones (such as mobile phones or cellular phones), notebook PCs, and monitors has expanded. As these liquid crystal display devices, an active matrix driving LCD device capable of performing high-definition display is employed. First, referring to FIG. 6, a typical configuration of the active matrix driving LCD device will be outlined. FIG. 6 schematically shows a main configuration connected to a pixel in a liquid crystal display unit, using an equivalent circuit.

Generally, a display unit 960 of the active matrix driving LCD device includes a semiconductor substrate, an opposing substrate, and a liquid crystal sealed in between these two substrates by opposing these two substrates. On the semiconductor substrate, transparent pixel electrodes 964 and thin-film transistors (TFTs) 963 are arranged in a matrix form (of 1280×3 pixel rows×1024 pixel columns in the case of a color SXGA panel, for example). One transparent electrode 967 is formed on an entire surface of the opposing substrate.

Turning on and off of a TFT 963 having a switching function is controlled by a scan signal. When the TFT 963 is turned on, a gray scale signal voltage corresponding to a video data signal is applied to a corresponding pixel electrode 964. Transmittance of the liquid crystal is changed by a potential difference between each pixel electrode 964 and the opposing substrate electrode 967, and even after the TFT 963 has been turned off, the potential difference is held by a liquid crystal capacitance 965 and an auxiliary capacitance 966 for a certain period, thereby displaying an image.

On the semiconductor substrate, data lines 962 and scan lines 961 are wired in the form of a grid (in which 1280×3 data lines and 1024 scan lines are arranged in the case of the color SXGA panel described above). A data line 962 sends a plurality of level voltages (gray scale signal voltages) applied to each pixel electrode 964, and a scan line 961 sends the scan signal. Due to a capacitance produced at an intersection between each of the scan lines 961 and each of the data lines 962 and a liquid crystal capacitance sandwiched between the semiconductor substrate and the opposing substrate, the scan lines 961 and the data lines 962 have become a large capacitive load.

The scan signal is supplied to a scan line 961 from a gate driver 970, and a grayscale signal voltage is supplied to each pixel electrode 964 from a data driver 980 through a data line 962. The gate driver 970 and the data driver 980 are controlled by a display controller 950. A clock CLK, a control signal, and a voltage supply that are necessary are supplied from the display controller 950 to each of the gate driver 970 and the data driver 980, and video data is supplied to the data driver 980. Currently, digital data is beginning to be wide spread used as the video data.

Rewriting of data of one screen is performed in one frame period (of approximately 0.017 seconds, usually). Data is successively selected every pixel row (every line) by each scan line, and a gray scale voltage signal is supplied from each data line within a selection period.

While the gate driver 970 needs to supply the scan signal of at least binary values, the data driver 980 needs to drive a data line by the gray scale voltage signal of multi-valued levels in accordance with the number of gray scales. For this reason, the data driver 980 includes a decoder that converts the video data to an analog voltage and a digital-to-analog converter circuit (DAC) formed of an output amplifier that amplifies the analog voltage and outputs the amplified analog voltage to a corresponding data line 962.

As a method of driving a large-screen display device such as a LCD TV, a dot inversion driving scheme capable of providing high image quality is adopted. The dot inversion driving scheme is the driving scheme in which an opposing substrate electrode voltage VCOM is set to a constant voltage and voltage polarities held in adjacent pixels are mutually opposite in the display panel 960 in FIG. 6. For this reason, polarities of voltages output to the adjacent data lines (962) become positive-polarity and negative-polarity with respect to the opposing substrate electrode voltage VCOM. The data driver 980 in the dot inversion driving scheme must output positive-polarity and negative-polarity gray scale signal voltages, at least two voltage supplies having a potential difference which is approximately twice of the maximum value of a liquid crystal application voltage (that is a potential difference between a gray scale voltage and the opposing substrate electrode voltage) are supplied to the output amplifier of the data driver.

FIG. 7 is a diagram showing an example of a typical configuration of an output circuit (composed by a positive-polarity amplifier, a negative-polarity amplifier, and an output switch circuit) for two outputs in a data driver that performs dot inversion driving. In FIG. 7, two adjacent data lines are connected to driver output terminals P1 and P2. The output circuit in FIG. 7 includes a positive-polarity amplifier 91, a negative-polarity amplifier 92, and an output switch circuit 30. To the positive-polarity amplifier 91, a high-potential voltage supply VDD2 and a low-potential voltage supply VSS are provided. Based on a positive-polarity reference voltage V11, the positive-polarity amplifier 91 performs amplification and outputs a positive-polarity gray scale voltage Vout1 to an amplifier output terminal N11. To the negative-polarity amplifier 92, the high-potential voltage supply VDD2 and the low-potential voltage supply VSS are provided. Based on a negative-polarity reference voltage V21, the negative-polarity amplifier 92 performs amplification and outputs a negative-polarity gray scale voltage Vout2 to an amplifier output terminal N12. The opposing substrate electrode voltage VCOM is set to be close to an intermediate voltage between the high-potential voltage supply VDD2 and the low-potential voltage supply VSS.

The positive-polarity amplifier 91 includes a current source M15 with a first terminal thereof connected to a low-potential voltage supply VSS, an N-channel differential pair (M11, M12) with coupled sources thereof connected to a second terminal of the current source M15, a current mirror (M13, M14) connected between an output pair of the N-channel differential pair (M11, M12) and a high-potential voltage supply VDD2, an amplifying transistor M16 connected between the high-potential voltage supply VDD2 and the amplifier output terminal N11, and a current source M17 connected between the low-potential voltage supply VSS and the amplifier output terminal N11. An output terminal of the current mirror (a connection node between a drain of the N-channel transistor M12 and a drain of the P-channel transistor M14) is connected to a gate of the amplifying transistor M16. The positive-polarity amplifier 91 has a voltage follower configuration in which the positive-polarity reference voltage V11 is supplied to a non-inverting input terminal (a gate of the transistor M12) of the N-channel differential pair (M11, M12) and an inverting input terminal (a gate of the transistor M11) of the N-channel differential pair (M11, M12) is connected to the amplifier output terminal N11. Since the positive-polarity reference voltage V11 is a voltage signal indicative of a voltage between the voltage VCOM and the high-potential voltage supply VDD2, the positive-polarity amplifier 91 in FIG. 7 can be implemented with a simple configuration using the differential pair of a single polarity and with a saved area.

The negative-polarity amplifier 92 has a configuration of a polarity reverse to that of the positive-polarity amplifier 91. The negative-polarity amplifier 92 includes a current source 25 with a first terminal thereof connected to the high-potential voltage supply VDD2, a P-channel differential pair (M21, M22) with coupled sources thereof connected to a second terminal of the current source M25, a current mirror (M23, M24) connected between an output pair of the P-channel differential pair (M21, M22) and the low-potential voltage supply VSS, an amplifying transistor M26 connected between the low-potential voltage supply VSS and the amplifier output terminal N12, and a current source M27 connected between the high-potential voltage supply VDD2 and the amplifier output terminal N12. An output terminal of the current mirror (a connection node between a drain of the P-channel transistor M22 and a drain of the N-channel transistor M24) is connected to a gate of the amplifying transistor M26. The negative-polarity amplifier 92 has a voltage follower configuration in which the negative-polarity reference voltage V21 is supplied to a non-inverting input terminal (a gate of the transistor M22) of the P-channel differential pair (M21, M22) and an inverting input terminal (a gate of the transistor M23) of the N-channel differential pair (M21, M22) is connected to the amplifier output terminal N12. Since the negative-polarity reference voltage V21 is a voltage signal indicative of a voltage between the voltage VCOM and the low-potential voltage supply VSS, the negative-polarity amplifier 92 can be implemented with a simple configuration using the differential pair of a single polarity and with a saved area.

The output switch circuit 30 includes switches controlled by control signals S1 and S2. When switches SW11 and SW22 controlled by the control signal S1 are turned on, the amplifier output terminals N11 and N12 are connected to the driver output terminals P1 and P2, respectively. Then, the output voltage Vout1 of the positive-polarity amplifier 91 and the output voltage Vout2 of the negative-polarity amplifier 92 are output to the driver output terminals P1 and P2, respectively.

When switches SW12 and SW21 controlled by the control signal S2 are turned on, the amplifier output terminals N11 and N12 are connected to the driver output terminals P2 and P1, respectively. Then, the output voltage Vout1 of the positive-polarity amplifier 91 and the output voltage Vout2 of the negative-polarity amplifier 92 are output to the driver output terminals P2 and P1, respectively.

In the dot inversion driving scheme in recent times, in order to reduce power consumption, a driving method is being carried out where polarities of just N pixels in a pixel column in a date line direction are set to be the same (which is driving for dot inversion for each N horizontal periods). In this case, though polarities of voltages of adjacent data lines are reverse to each other, polarities of voltages of the N pixels output to a same data line become identical.

In the dot inversion driving scheme for each horizontal period, a positive-polarity reference signal and a negative-polarity reference signal are alternately output to a same data line. Thus, a charging operation is always performed when the positive-polarity reference signal is output, while a discharging operation is always performed when the negative-polarity reference signal is output.

In the dot inversion driving for each N horizontal periods, N gray scale signals of a same polarity are output to a same data line. Thus, the discharging operation becomes necessary even when the positive-polarity reference signal is output and the charging operation becomes necessary even when the negative-polarity reference signal is output.

That is, it becomes necessary for each of the positive-polarity amplifier 91 and the negative-polarity amplifier 92 to have both sufficient charging and discharging capabilities.

The positive-polarity amplifier 91 in FIG. 7 performs the discharging operation using the current source M17, while the negative-polarity amplifier 92 in FIG. 7 performs the charging operation using the current source M27. Thus, discharging capability of the positive-polarity amplifier 91 and charging capability of the negative-polarity amplifier 92 are usually poor. In order to enhance the discharging capability of the current source M17 and the charging capability of the current source M27, respective current values of the current sources need to be increased. However, a problem that static power consumptions of the amplifiers increase may thereby arise. On the other hand, as an amplifier configuration in which the static power consumption of the amplifier can be reduced and each of the discharging capability of the positive-polarity amplifier 91 and the charging capability of the negative-polarity amplifier 92 is high, an AB class circuit in Patent Document 1 listed later, for example, can be employed.

FIG. 8 is a diagram showing a configuration of the AB class output circuit in Patent Document 1. An output stage is composed of a P-channel transistor M85 connected between a high-potential voltage supply VDD and an output terminal Vout and an N-channel transistor M86 connected between the output terminal Vout and a low-potential voltage supply VSS. The output stage has high charging and discharging capabilities with respect to the output terminal Vout. A gate NP1 of the P-channel transistor M85 is connected to an output of a driver 89 that has received an input signal Vin, and the P-channel transistor M85 performs a charging operation. A change in the input signal Vin is transferred to a gate NN1 of the N-channel transistor M86 via an intermediate stage (M81, M82), and the N-channel transistor M86 performs a discharging operation. The intermediate stage is formed of a P-channel floating current source M81, an N-channel floating current source M82, and current sources M83 and M84. A bias voltage BP8 is applied to a gate of the P-channel floating current source M81, and a bias voltage BN8 is applied to a gate of the N-channel floating current source M82. The P-channel floating current source M81 and the N-channel floating current source M82 are connected between the gate (NP1) of the transistor M85 and the gate (NN1) of the transistor M86. The current source M83 is connected between the high-potential voltage supply VDD and the gate NP1 of the P-channel transistor M85, while the current source M84 is connected between the low-potential voltage supply VSS and the gate NN1 of the N-channel transistor M86. A sum of currents of the floating current sources M81 and M82 is set to be substantially the same as a current of each of the current sources M83 and M84.

An operation of the AB class output circuit in FIG. 8 will be described. When a potential of the terminal NP1 is changed to low in response to an input voltage Vin, the P-channel transistor M85 performs the charging operation. In this case, a current of the N-channel floating current source M82 does not change, but a current of the P-channel floating current source 81 is reduced. Thus, a potential of the terminal NN1 is changed to low, so that the discharging operation of the N-channel transistor M86 is stopped. Accordingly, the AB class output circuit in FIG. 8 can perform the charging operation at high speed.

On the other hand, when the potential of the terminal NP1 is changed to high in response to the input voltage Vin, the charging operation of the P-channel transistor M85 is stopped. In this case, the current of the N-channel floating current source M82 does not change, but the current of the P-channel floating current source 81 is increased. Thus, the potential of the terminal NN1 is changed to high, so that the N-channel transistor M86 performs the discharging operation. Accordingly, the AB class output circuit in FIG. 8 can perform the discharging operation at high speed.

When a relationship between the sum of currents of the floating current sources M81 and M82 and the current of each of the current sources M83 and M84 is maintained, current values of the respective current sources can be reduced sufficiently.

According to Patent Document 2 listed below, which has cited Patent Document 1, the driver 89 can be formed of an N-channel differential pair. In this case, the AB class output circuit in FIG. 8 can be replaced by the positive-polarity amplifier 91 in FIG. 7.

Further, when an output terminal of the driver 89 is configured to be connected to the terminal NN1 and the driver 89 is formed of a P-channel differential pair, the AB class output circuit can also be replaced by the negative-polarity amplifier 92 in FIG. 7.

[Patent Document 1]
JP Patent Kokoku Publication No. JP-B-6-91379 (FIG. 1)
[Patent Document 2]
JP Patent Kokai Publication No. JP-P2005-124120A (FIG. 1)

SUMMARY OF THE DISCLOSURE

The entire disclosure of Patent Documents 1 and 2 is incorporated herein by reference thereto.

Recently, a LCD TV screen has rapidly become larger in size, and a large screen such as a 50-inch LCD TV has been developed. When the LCD TV screen has become large, capacitance of a data line increases. Thus, charging and discharging power increases. Since a data line is driven by an output amplifier of a data driver, the output amplifier with a high driving capability is needed. An idling current of the output amplifier also increases, so that power consumption of the output amplifier itself also increases.

Since an increase in power consumption raises a temperature in a driver LSI, a problem of heat generation may arise. In the driver LSI with the great number of output pins per each LSI, in particular, the heat generation is becoming a serious problem.

Accordingly, an object of the present invention is to provide a data driver that reduces power consumption of a driver LSI.

It is another object of the present invention to provide a data driver of a display device with a saved area or with reduced cost.

It is still another object of the present invention to provide a low-cost display device in which by using the data driver, power consumption is reduced.

The invention disclosed in this application is generally configured as follows.

According to one aspect of the present invention, there is provided a data driver including:

a positive-polarity amplifier including a first input stage that receives at least one voltage selected from among a plurality of positive-polarity reference voltages and a first output stage that receives an output of said first input stage, performs amplification, and outputs a voltage to a first amplifier output terminal;

a negative-polarity amplifier including a second input stage that receives at least one voltage selected from among a plurality of negative-polarity reference voltages and a second output stage that receives an output of the second input stage, performs amplification, and outputs a voltage to a second amplifier output terminal; and an output switch circuit that performs switching between straight connection of the first and second amplifier output terminals to first and second driver output terminals, respectively and cross connection of the first and second amplifier output terminals to the second and first driver output terminals, respectively, responsive to a control signal.

The data driver is provided with a high-potential voltage supply, a low-potential voltage supply as voltage supplies, and an intermediate-potential voltage supply having a potential intermediate between the high-potential voltage supply and the low-potential voltage supply being supplied as a voltage supply; wherein the high-potential voltage supply and the low-potential voltage supply are provided to the first input stage of the positive-polarity, amplifier;

the high-potential voltage supply and the intermediate-potential voltage supply are provided to the first output stage of the positive-polarity amplifier;

the high-potential voltage supply and the low-potential voltage supply are provided to the second input stage of the negative-polarity amplifier; and the intermediate-potential voltage supply and the low-potential voltage supply are provided to the second output stage of the negative-polarity amplifier.

A data driver according to the present invention includes:

a positive-polarity reference voltage generation circuit that outputs a plurality of positive-polarity reference voltages having mutually different potentials;

a positive-polarity decoder that selects at least one reference voltage in accordance with an input first digital signal from among the positive-polarity reference voltages and outputs the at least one reference voltage;

a positive-polarity amplifier including:

a first differential unit that receives the at least one reference voltage selected by the positive-polarity decoder; and a first output stage that receives an output of the first differential unit, performs amplification, and outputs a voltage to a first amplifier output terminal;

a negative-polarity reference voltage generation circuit that outputs a plurality of negative-polarity reference voltages having mutually different potentials;

a negative-polarity decoder that selects at least one reference voltage in accordance with an input second digital signal from among the negative-polarity reference voltages and outputs the at least one reference voltage;

a negative-polarity amplifier including:

a second differential unit that receives the at least one reference voltage selected by the negative-polarity decoder; and a second output stage that receives an output of the second differential unit, performs amplification, and outputs a voltage to a second amplifier output terminal; and an output switch circuit that performs switching between straight connection of the first and second amplifier output terminals to first and second driver output terminals, respectively and cross connection of the first and second amplifier output terminals to the second and first driver output terminals, respectively, responsive to a control signal.

The data driver is provided with a high-potential voltage supply, a low-potential voltage supply as voltage supplies, and an intermediate-potential voltage supply having a potential intermediate between the high-potential voltage supply and the low-potential voltage supply being supplied as a voltage supply; wherein the high-potential voltage supply and the low-potential voltage supply are provided to the first differential unit of the positive-polarity amplifier;

the high-potential voltage supply and the intermediate-potential voltage supply are provided to the at least first output stage of the positive-polarity amplifier excluding the first differential unit;

the high-potential voltage supply and the low-potential voltage supply are provided to the second differential unit of the negative-polarity amplifier; and the intermediate-potential voltage supply and the low-potential voltage supply are provided to the at least second output stage of the negative-polarity amplifier excluding the second differential unit.

In the data driver according to the present invention, the reference voltage between the high-potential voltage supply and the intermediate-potential voltage supply, selected by the positive-polarity decoder, is supplied to the first differential unit of the positive-polarity amplifier; and the reference voltage between the low-potential voltage supply and the intermediate-potential voltage supply, selected by the negative-polarity decoder, is supplied to the second differential unit of the negative-polarity amplifier.

In the data driver according to the present invention, the positive-polarity decoder may be driven by the high-potential voltage supply and the intermediate-potential voltage supply; and the negative-polarity decoder may be driven by the intermediate-potential voltage supply and the low-potential voltage supply.

In the data driver according to the present invention, the first differential unit of the positive-polarity amplifier includes:

a first current source connected to the low-potential voltage supply;

a first differential pair of a first conductivity type that receives the reference voltage selected by the positive-polarity decoder at a non-inverting input terminal thereof, the first differential pair being driven by the first current source; and a first load circuit connected between an output pair of the first differential pair and the high-potential voltage supply. The first output stage includes:

a first charging transistor connected between the high-potential voltage supply and the first amplifier output terminal, a control terminal of the first charging transistor being connected to one of connection nodes between the output pair of the first differential pair and the first load circuit; and a first discharging transistor connected between the first amplifier output terminal and the intermediate-potential voltage supply;

an inverting input terminal of the first differential pair being connected to the first amplifier output terminal.

The second differential pair of the negative-polarity amplifier according to the present invention may include:

a second current source connected to the high-potential voltage supply;

a second differential pair of a second conductivity type that receives the reference voltage selected by the negative-polarity decoder at a non-inverting input terminal thereof, the second differential pair being driven by the second current source; and a second load circuit connected between an output pair of the second differential pair and the low-potential voltage supply. The second output stage may include:

a second discharging transistor connected between the low-potential voltage supply and the second amplifier output terminal, a control terminal of the second discharging transistor being connected to one of connection nodes between the output pair of the second differential pair and the second load circuit; and a second charging transistor connected between the second amplifier output terminal and the intermediate-potential voltage supply;

an inverting input terminal of the second differential pair being connected to the second amplifier output terminal.

The first differential unit of the positive-polarity amplifier in the data according to the present invention includes:

first current sources constituted from a plurality of current sources, connected to the low-potential voltage supply;

first differential pairs constituted from a plurality of differential pairs of a first conductivity type that receive reference voltages selected by the positive-polarity decoder at non-inverting input terminals thereof, respectively, the first differential pairs being driven by the first current sources, respectively; and a first load circuit connected between output pairs of the first differential pairs connected in common and the high-potential voltage supply. The first output stage includes:

a first charging transistor connected between the high-potential voltage supply and the first amplifier output terminal, a control terminal of the first charging transistor being connected to one of connection nodes between the output pairs of the first differential pairs connected in common and the first load circuit; and a first discharging transistor connected between the first amplifier output terminal and the intermediate-potential voltage supply;

non-inverting input terminals of the first differential pairs being connected in common to the first amplifier output terminal.

The second differential unit of the negative-polarity amplifier in the data driver according to the present invention may include:

second current sources constituted from a plurality of current sources, connected to the high-potential voltage supply;

second differential pairs constituted from a plurality of differential pairs of a second conductivity type that receive reference voltages selected by the negative-polarity decoder at non-inverting terminals thereof, the second differential pairs being driven by the second current sources, respectively; and a second load circuit connected between output pairs of the second differential pairs connected in common and the low-potential voltage supply. The second output stage may include:

a second discharging transistor connected between the low-potential voltage supply and the second amplifier output terminal, a control terminal of the second discharging transistor being connected to one of connection nodes between the output pairs of the second differential pairs connected in common and the second load circuit; and a second charging transistor connected between the second amplifier output terminal and the intermediate-potential voltage supply;

non-inverting input terminals of the second differential pairs being connected in common to the second amplifier output terminal.

The first differential unit of the positive-polarity amplifier according to the present invention includes:

a first current source connected to the low-potential voltage supply;

a first differential pair of a first conductivity type that receives the reference voltage selected by the positive-polarity decoder at a non-inverting input terminal thereof, the first differential pair being driven by the first current source; and a first load circuit connected between an output pair of the first differential pair and the high-potential voltage supply. The first output stage includes:

a first charging transistor connected between the high-potential voltage supply and the first amplifier output terminal, a control terminal of the first charging transistor being connected to one of connection nodes between the output pair of the first differential pair and the first load circuit; and a first discharging transistor connected between the first amplifier output terminal and the intermediate-potential voltage supply;

an inverting input terminal of the first differential pair being connected to the first amplifier output terminal.

The positive-polarity amplifier further has a first intermediate stage including:

a third current source connected between the control terminal of the first charging transistor and the high-potential voltage supply;

a fourth current source connected between a control terminal of the first discharging transistor and the intermediate-potential voltage supply; and a first floating current source transistor of a first conductivity type and a second floating current source transistor of a second conductivity type both connected between the control terminal of the first charging transistor and the control terminal of the first discharging transistor, each of the first and second floating current source transistors receiving a bias voltage at a control terminal thereof.

The second differential pair of the negative-polarity amplifier in the data driver according to the present invention includes:

a second current source connected to the high-potential voltage supply;

a second differential pair of a second conductivity type that receives the reference voltage selected by the negative-polarity decoder at a non-inverting input terminal thereof, the second differential pair being driven by the second current source; and a second load circuit connected between an output pair of the second differential pair and the low-potential voltage supply. The second output stage includes:

a second discharging transistor connected between the low-potential voltage supply and the second amplifier output terminal, a control terminal of the second discharging transistor being connected to one of connection nodes between the output pair of the second differential pair and the second load circuit; and a second charging transistor connected between the second amplifier output terminal and the intermediate-potential voltage supply;

an inverting input terminal of the second differential pair being connected to the second amplifier output terminal.

The negative-polarity amplifier further has a second intermediate stage including:

a fifth current source connected between the control terminal of the second discharging transistor and the low-potential voltage supply;

a sixth current source connected between a control terminal of the second charging transistor and the intermediate-potential voltage supply; and a third floating current source transistor of a first conductivity type and a fourth floating current source transistor of a second conductivity type both connected between the control terminal of the second charging transistor and the control terminal of the second discharging transistor, each of the third and fourth floating current source transistors receiving a bias voltage at a control terminal thereof.

The data driver according to the present invention may include:

a first auxiliary transistor connected between the control terminal of the first charging transistor and the high-potential voltage supply, the first auxiliary transistor being biased by a first bias voltage; and a second auxiliary transistor connected between the control terminal of the second discharging transistor and the low-potential voltage supply, the second auxiliary transistor being biased by a second bias voltage.

In the data driver according to the present invention, the output switch circuit includes a precharge circuit that precharges the first and second driver output terminals to predetermined voltages, respectively.

In the data driver according to the present invention, immediately before the first and second amplifier output terminals are straightly connected to the first and second output terminals, respectively, the precharge circuit may precharge the first driver output terminal to the intermediate-potential voltage supply or higher and may precharge the second driver output terminal to the voltage of the intermediate-potential voltage supply or lower; and immediately before the first and second amplifier output terminals are cross-connected to the second and first driver output terminals, respectively, the precharge circuit may precharge the second driver output terminal to the intermediate-potential voltage supply or higher and may precharge the first driver output terminal to the voltage of the intermediate-potential voltage supply or lower.

In the data driver according to the present invention, the output switch circuit includes:

first and second switches with first terminals thereof connected in common to the first amplifier output terminal and second terminals thereof connected to the first and second driver output terminals, respectively; and third and fourth switches with first terminals thereof connected in common to the second amplifier output terminal and second terminals thereof connected to the first and second driver output terminals, respectively.

The precharge circuit may precharge the first driver output terminal to the intermediate-potential voltage supply or higher and may precharge the second driver output terminal to the voltage of the intermediate-potential voltage supply or lower immediately before the first and fourth switches are turned on; and the precharge circuit may precharge the second driver output terminal to the intermediate-potential voltage supply or higher and may precharge the first driver output terminal to the voltage of the intermediate-potential voltage supply or lower immediately before the second and third switches are turned on.

A digital-to-analog converter circuit according to the present invention includes:

a first digital-to-analog converter unit that performs conversion to produce a first analog voltage corresponding to an input first digital signal and outputs the first analog voltage to a first terminal thereof;

a second digital-to-analog converter unit that performs conversion to produce a second analog voltage corresponding to an input second digital signal and outputs the second analog voltage to a second terminal thereof.

The first digital-to-analog converter unit includes:

a positive-polarity decoder that selects at least one positive-polarity reference voltage corresponding to the first digital signal from among a plurality of positive-polarity reference voltages output from a positive-polarity reference voltage generation circuit and outputs the at least one positive-polarity reference voltage; and a positive-polarity amplifier including a first differential unit that receives the at least one positive-polarity reference voltage selected by the positive-polarity decoder and a first output stage that receives an output of the first differential unit, performs amplification, and outputs the voltage to the first terminal.

The second digital-to-analog converter unit includes:

a negative-polarity decoder that selects at least one negative-polarity reference voltage corresponding to the second digital signal from among a plurality of negative-polarity reference voltages output from a negative-polarity reference voltage generation circuit and outputs the at least one negative-polarity reference voltage; and a negative-polarity amplifier including a second differential unit that receives the at least one negative-polarity reference voltage selected by the negative-polarity decoder and a second output stage that receives an output of the second differential unit, performs amplification, and outputs the voltage to the second terminal;

The digital-to-analog converter circuit further includes:

an output switch circuit that performs switching between straight connection of the first terminal of the first digital-to-analog converter unit and the second terminal of the second digital-to-analog converter unit to the first output terminal and the second output terminal, respectively and cross connection of the second terminal of the second digital-to-analog converter unit and the first terminal of the first digital-to-analog converter unit to the first output terminal and the second output terminal, respectively.

The digital-to-analog converter circuit is provided with a high-potential voltage supply, a low-potential voltage supply as voltage supplies, and an intermediate-potential voltage supply having a potential between the high-potential voltage supply and the low-potential voltage supply is supplied as a voltage supply; wherein the high-potential voltage supply and the low-potential voltage supply are provided to the first differential unit of the positive-polarity amplifier;

the high-potential voltage supply and the intermediate-potential voltage supply are provided to the at least first output stage excluding the first differential unit;

the high-potential voltage supply and the low-potential voltage supply are provided to the second differential unit of the negative-polarity amplifier; and the low-potential voltage supply and the intermediate-potential voltage supply are provided to the at least second output stage excluding the second differential unit.

According to the present invention, a display device including the data driver that drives first and second data line connected to the first and second output terminal, respectively, is provided.

According to the present invention, the intermediate-potential voltage supply is set to a voltage close to an opposing substrate electrode voltage VCOM of the display panel.

The meritorious effects of the present invention are summarized as follows.

According to the present invention, a potential difference between the voltage supplies provided to each of the positive-polarity amplifier and the negative-polarity amplifier except the differential unit is set to a half of a conventional configuration. Power consumption of each of the positive-polarity amplifier and the negative-polarity amplifier thus can be reduced. Further, a data driver for a display device according to the present invention can realize area saving and cost reduction.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

PREFERRED MODES OF THE INVENTION

Figure 1:
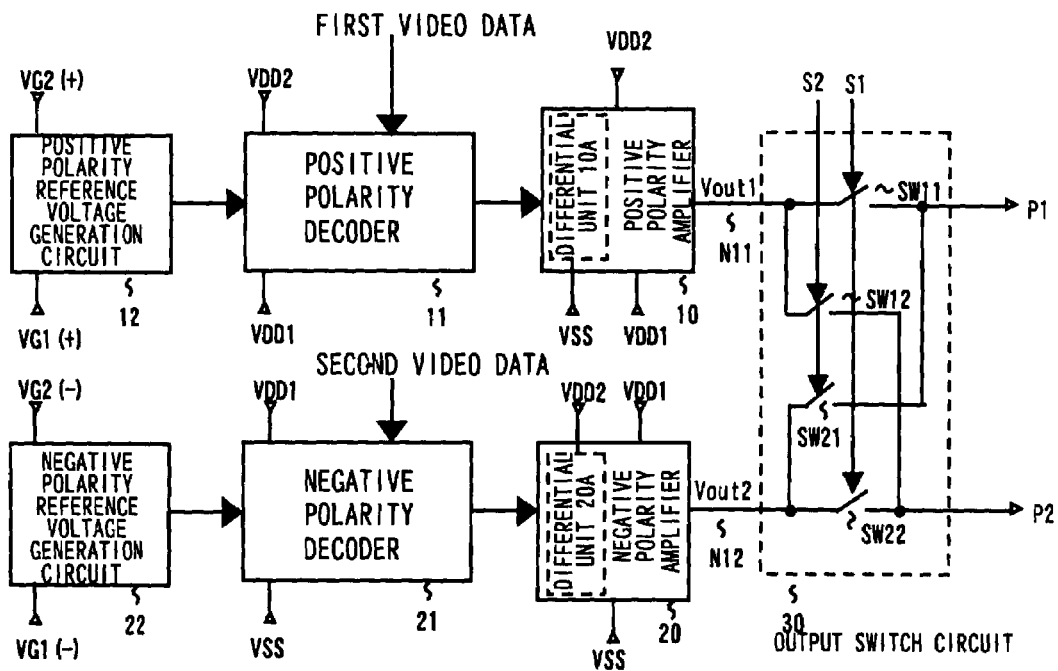
FIG. 1 is a diagram showing a configuration of an embodiment of the present invention.

In order to describe the present invention described above in further detail, a description will be given below with reference to appended drawings. FIG. 1 is a diagram showing a configuration of an example of the present invention. FIG. 1 shows a configuration of two DACs (digital-to-analog converter circuits) for two outputs, used as an LCD data driver that performs dot inversion driving. Referring to FIG. 1, the data driver in this embodiment includes a positive-polarity reference voltage generation circuit 12, a positive-polarity decoder 11, a positive-polarity amplifier 10, a negative-polarity reference voltage generation circuit 22, a negative-polarity decoder 21, a negative-polarity amplifier 20, and an output switch circuit 30. These circuits generally operate as follows.

At least two gamma voltages VG1(+) and VG2(+) are supplied to the positive-polarity reference voltage generation circuit 12, and the positive-polarity reference voltage generation circuit 12 outputs the necessary number of positive-polarity reference voltages by voltage division of the gamma voltages VG1(+) and VG2(+) or the like. One positive-polarity reference voltage generation circuit 12 may be provided for plural sets of positive-polarity decoders 11 and positive-polarity amplifiers 10.

The positive-polarity decoder 11 selects at least one reference voltage (which may be a plurality of reference voltages) in accordance with input first video digital data from among positive-polarity reference voltages output from the positive-polarity reference voltage generation circuit 12 and outputs the at least one selected reference voltage (which may be a plurality of reference voltages).

Based on the at least one reference voltage selected by the positive-polarity decoder 11, the positive-polarity amplifier 10 performs amplification and outputs a positive-polarity gray scale voltage Vout1 to an amplifier output terminal N11.

At least two gamma voltages VG1(−) and VG2(−) are supplied to the negative-polarity reference voltage generation circuit 22, and the negative-polarity reference voltage generation circuit 22 outputs the necessary number of negative-polarity reference voltages by voltage division of the gamma voltages VG1(−) and VG2(−) or the like. One negative-polarity reference voltage generation circuit 22 may be provided for plural sets of negative-polarity decoders 21 and negative-polarity amplifiers 20.

The negative-polarity decoder 21 selects at least one reference voltage (which may be a plurality of reference voltages) in accordance with input second video digital data from among negative-polarity reference voltages output from the negative-polarity reference voltage generation circuit 22 and outputs the at least one selected reference voltage (which may be a plurality of reference voltages).

Based on the at least one reference voltage selected by the negative-polarity decoder 21, the negative-polarity amplifier 20 performs amplification and outputs a negative-polarity gray scale voltage Vout2 to an amplifier output terminal N12.

Figure 7:
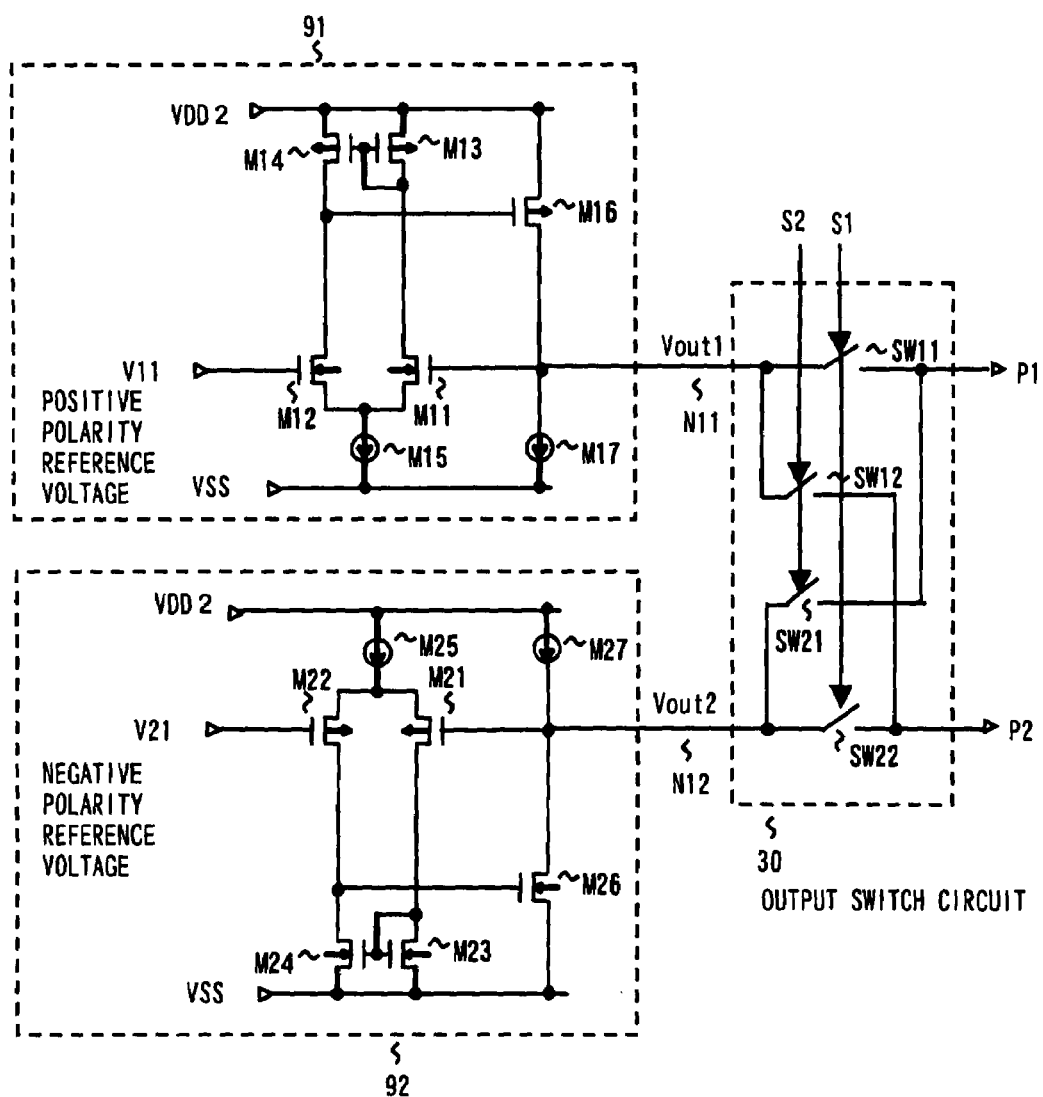
FIG. 7 is a diagram showing an output circuit for two outputs in a data driver that performs dot inversion driving.

The output switch circuit 30 has the same configuration as an output switch circuit 30 described with reference to FIG. 7, and switches and outputs the output voltage Vout1 of the positive-polarity amplifier 10 and the output voltage Vout2 of the negative-polarity amplifier 20 to driver output terminals P1 and P2, responsive to control signals S1 and S2.

A feature of the DACs in FIG. 1 is that in addition to a high-potential voltage supply VDD2 and a low-potential voltage supply VSS, an intermediate-potential voltage supply VDD1 close to an opposing substrate voltage VCOM is provided, and three voltage supplies are supplied to each of the positive-polarity amplifier 10 and the negative-polarity amplifier 20.

To the positive-polarity amplifier 10 except a differential unit 10A, the high-potential voltage supply VDD2 and the intermediate-potential voltage supply VDD1 are provided. To the differential unit 10A, the high-potential voltage supply VDD2 and the low-potential voltage supply VSS are provided.

To the negative-polarity amplifier 20 except a differential unit 20A, the intermediate-potential voltage supply VDD1 and the low-potential voltage supply VSS are provided. To the differential unit 20A, the high-potential voltage supply VDD2 and the low-potential voltage supply VSS are provided.

A potential difference between the voltage supplies provided to the positive-polarity amplifier 10 except the differential unit 10A is (VDD2−VDD1), and a potential difference between the voltage supplies provided to the negative-polarity amplifier 20 except the differential unit 20A is (VDD1−VSS), provided that VDD1≈VCOM. These potential differences are set to a half of those in a conventional art, (each of which is twice of the maximum value of a liquid crystal application voltage). Power consumptions of the positive-polarity amplifier 10 and the negative-polarity amplifier 20 thus can be reduced.

On the other hand, a potential difference between the voltage supplies provided to each of the differential unit 10A of the positive-polarity amplifier 10 and the differential unit 20A of the negative-polarity amplifier 20 is (VDD2−VSS), and is set to be the same as that in the conventional art (which is twice of the maximum value of the liquid crystal application voltage). The differential unit 10A of the positive-polarity amplifier 10 can be formed of only an N-channel differential pair, and the differential unit 20A of the negative-polarity amplifier 20 can be formed of only a P-channel differential pair.

A further detailed description of this is as follows. In the positive-polarity amplifier 10, the N-channel differential pair of the differential unit 10A is turned off when an input signal is of a voltage higher than the low-potential voltage supply VSS and lower than threshold voltage of the N-channel differential pair. Then, the positive-polarity amplifier 10 does not operate properly. On the contrary, in the configuration in FIG. 1, the input signal which is of a voltage (a positive-polarity reference voltage) between the one close to the voltage VCOM and the high-potential voltage supply VDD2 and which is always higher than the threshold voltage of the N-channel differential pair is supplied to the positive-polarity amplifier 10. For this reason, even if the differential unit 10A of the positive-polarity amplifier 10 is composed of only the N-channel differential pair, the positive-polarity amplifier 10 can operate properly.

Likewise, with respect to the negative-polarity amplifier 20 as well, the P-channel differential pair of the differential unit 20A is turned off when the input signal is of a voltage lower than the high-potential voltage supply VDD2 and higher than threshold voltage of the P-channel differential pair. Thus, the negative-polarity amplifier 20 does not operate properly. On the contrary, in the configuration in FIG. 1, the input signal which is of a voltage (a negative-polarity reference voltage) between the one close to the voltage VCOM and the low-potential voltage supply VSS, and which is always lower than a potential obtained by subtracting the threshold voltage of the P-channel differential pair from the high-potential voltage supply VDD2 is supplied to the negative-polarity amplifier 20. For this reason, even if the differential unit 20A of the negative-polarity amplifier 20 is composed of only the P-channel differential pair, the negative-polarity amplifier 20 can operate properly.

As described above, each of the positive-polarity amplifier 10 and the negative-polarity amplifier 20 in FIG. 1 can be formed of the differential pair of a single polarity. Accordingly, area saving can also be implemented.

Power consumption of each of the differential units 10A and 20A will be described. Generally, an idling current (a static consumption current) becomes necessary in order to operate an amplifier stably. It is a common practice to design a proportion of the idling current inside each of the positive-polarity amplifier 10 and the negative-polarity amplifier 20 so that the idling current in an output stage becomes several times the idling current of each differential unit. When a current value of a current source M15 in a differential unit in a positive-polarity amplifier 91 in FIG. 7 is 1 μA, a stable operation is easy to obtain when a current value of a current source M17 in the output stage is designed to be 5 to 7 μA. The same holds true for a negative-polarity amplifier 92 in FIG. 7 as well. An optimal current ratio between the differential unit and the output stage of course differs according to an amplifier configuration, a device size, device characteristics or the like. However, the idling current of the output stage is larger than that of the differential unit, in general.

Accordingly, a proportion of current consumption of the differential unit 10A to overall current consumption of the positive-polarity amplifier 10 is comparatively small, and a proportion of current consumption of the differential unit 20A to overall current consumption of the negative-polarity amplifier 20 is comparatively small. Thus, even if the potential difference between the voltage supplies of each of the differential units 10A and 20A is larger than a potential difference between the voltage supplies of each of an amplifier component portion (such as the output stage and the like) except each of the differential units 10A and 20A, an increase in power consumption is only a little.

Though the positive-polarity amplifier 10 may be generally composed by a rail-to-rail amplifier by supplying the high-potential voltage supply VDD2 and the intermediate-potential voltage supply VDD1, P-channel and N-channel differential pairs of both of polarities become necessary for the differential unit 10A in that case. A configuration of the differential unit 10A also becomes complex. For this reason, an increase in the area of the differential unit 10A and an increase in current that drives the differential pairs may arise.

Figure 3:
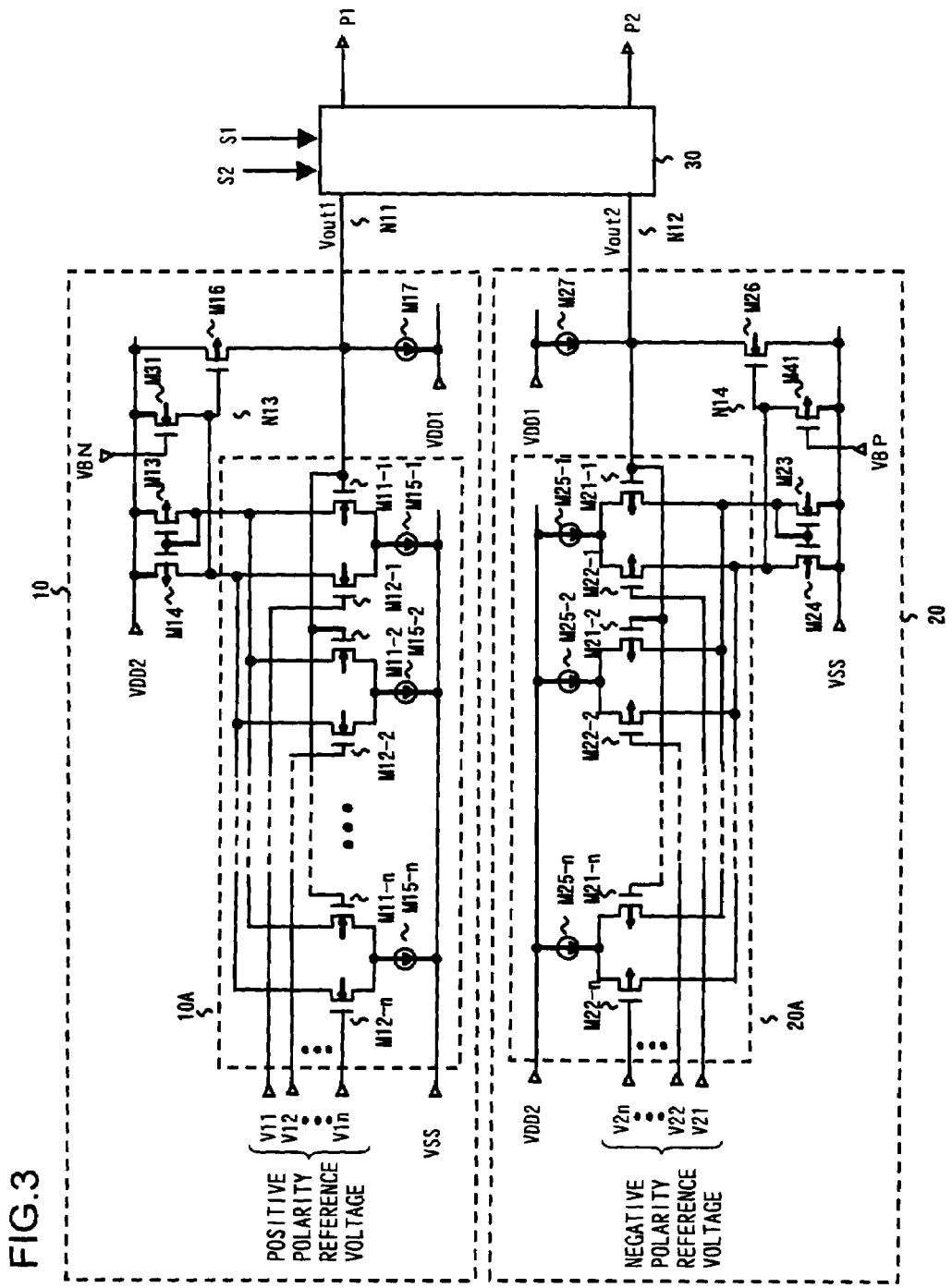
FIG. 3 is a diagram showing a configuration of a second example of the present invention.

In an output amplifier of a configuration having a plurality of differential pairs of both of the polarities, as shown in FIG. 3, in particular, which will be described later, provision of the differential pairs of both of the polarities leads to a great increase in the area of the output amplifier.

Then, in this embodiment, the differential unit 10A is so configured that the differential unit 10A can operate using the differential pair of the single polarity. The same holds true for the negative-polarity amplifier 20 as well.

In the DACs in FIG. 1, the high-potential voltage supply VDD2 and the intermediate-potential voltage supply VDD1 may be supplied to the positive-polarity decoder 11. The intermediate-potential voltage supply VDD1 and the low-potential voltage supply VSS may be supplied to the negative-polarity decoder 21.

By utilizing the intermediate-potential voltage supply VDD1, each of the positive-polarity decoder 11 and the negative-polarity decoder 21 can be formed of low-voltage transistors, thereby achieving area saving. In this case, however, when a positive-polarity reference voltage and a negative-polarity reference voltage have voltage levels close to the intermediate-potential voltage supply VDD1, respectively, each of the positive-polarity decoder 11 and the negative-polarity decoder 21 cannot be formed of transistors of the single polarity, and at least partially needs to have a CMOS configuration of P-channel and N-channel transistors.

When voltage supplies for the positive-polarity decoder 11 and the negative-polarity decoder 21 are set to the high-potential voltage supply VDD2 and the low-potential voltage supply VSS, each of the positive-polarity decoder 11 and the negative-polarity decoder 21 can also be formed of transistors of the single polarity. That is, the positive-polarity decoder 11 can be formed of high-voltage P-channel pass transistors alone, while the negative-polarity decoder 21 can be formed of high-voltage N-channel pass transistors alone.

Next, voltage supplies in this embodiment will be described.

In an embodiment shown in FIG. 1, a description was given to a case where the high-potential voltage supply VDD2, intermediate-potential voltage supply VDD1, and low-potential voltage supply VSS are provided as the voltage supplies for the DACs of the data driver. A magnitude relation among these three voltage supplies should only be relatively maintained, and absolute values of the voltage supplies may also be shifted.

Generally, a low-potential voltage supply VSS is used as the GND. However, an intermediate voltage supply VDD1 may be used as the GND, and the low-potential voltage supply VSS may be used as a negative-polarity voltage supply.

Figure 6:
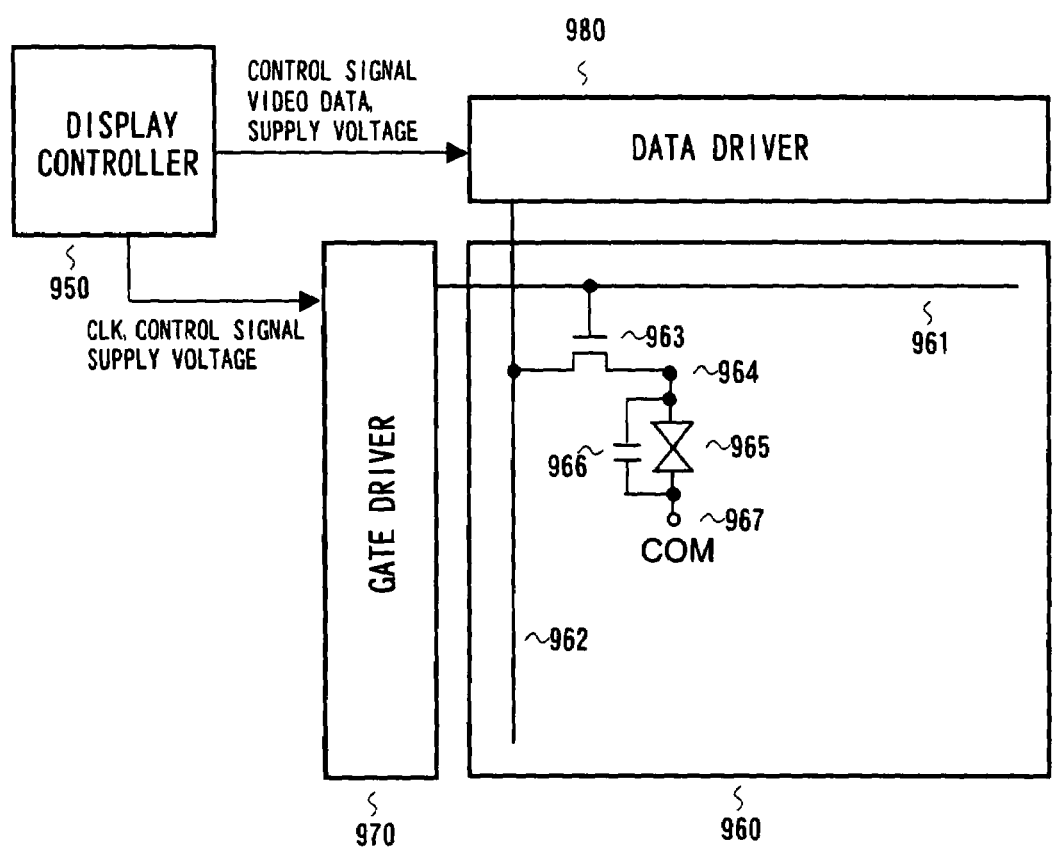
FIG. 6 is a diagram schematically showing a configuration of a liquid crystal display unit.

In this case, however, a gray scale signal supplied from a data driver 980 in FIG. 6 becomes a positive-polarity voltage (a positive-polarity polarity) and a negative-polarity voltage (a negative-polarity polarity) with respect to the GND. Thus, voltage levels (low and high levels) of a scan signal output from a gate driver 970 and an opposing substrate electrode voltage are shifted to a negative-polarity side, correspondingly.

Figure 2:
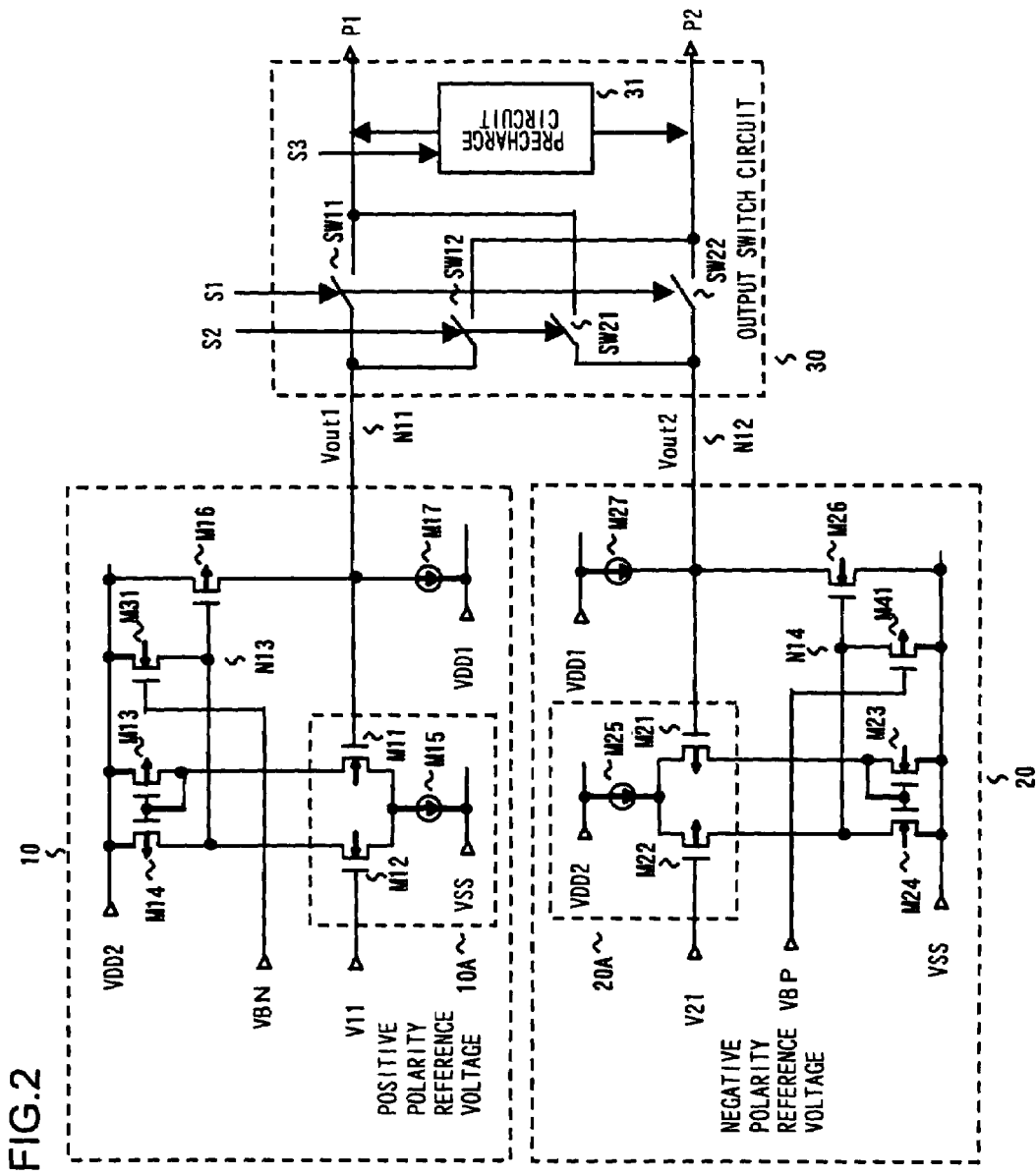
FIG. 2 is a diagram showing a configuration of a first example of the present invention.

FIG. 2 is a diagram showing a configuration of an example including the positive-polarity amplifier 10, negative-polarity amplifier 20, and output switch circuit 30 in the two DACs in FIG. 1.

Referring to FIG. 2, the positive-polarity amplifier 10 includes the differential unit 10A including a current source M15 with a first terminal thereof connected to the low-potential voltage supply VSS and an N-channel differential pair (M11, M12) with coupled sources thereof connected to a second terminal of the current source M15, a P-channel current mirror (M13, M14) connected between an output pair of the N-channel current mirror (M11, M12) and the high-potential voltage supply VDD2, an amplifying transistor M16 for a charging operation, connected between the high-potential voltage supply VDD2 and the amplifier output terminal N11, with a gate thereof connected to an output terminal (a connection node between the transistors M12 and M14) of the P-channel current mirror (M13, M14), and a current source M17 for a discharging operation, connected between the amplifier output terminal N11 and the intermediate voltage supply VDD1. A positive-polarity reference voltage V11 is applied to a non-inverting input terminal (a gate of the transistor M12) of an input pair of the N-channel differential pair (M11, M12), and an inverting input terminal (a gate of the transistor M11) is connected to the amplifier output terminal N11. Each of the current sources M15 and M17 can be formed of a transistor with a bias voltage applied to a gate thereof.

In this example, an N-channel transistor M31 with a drain thereof connected to the high-potential voltage supply VDD2, a source thereof connected to the gate of the transistor M16 (or a node N13), and a bias voltage VBN applied to a gate thereof is provided as an option.

The negative-polarity amplifier 20 includes the differential unit 20A having a current source M25 with a first terminal thereof connected to the high-potential voltage supply VDD2, and a P-channel differential pair (M21, M22) with coupled sources thereof connected to a second terminal of the current source M25, an N-channel current mirror (M23, M24) connected between an output pair of the P-channel current mirror (M21, M22) and the low-potential voltage supply VSS, an amplifying transistor M26 for a discharging operation, connected between the low-potential voltage supply VSS and the amplifier output terminal N12, with a gate thereof connected to an input terminal (a connection node between the transistors M22 and M24) of the N-channel current mirror (M23, M24), and a current source M27 for a charging operation, connected between the amplifier output terminal N12 and the intermediate voltage supply VDD1. A negative-polarity reference voltage V21 is applied to a non-inverting input terminal (a gate of the transistor M22) of an input pair of the P-channel differential pair (M21, M22), and an inverting input terminal (a gate of the transistor M21) is connected to the amplifier output terminal N12. Each of the current sources M25 and M27 can be formed of a transistor with a bias voltage applied to a gate thereof.

Further, a P-channel transistor M41 with a drain thereof connected to the low-potential voltage supply VSS, a source thereof connected to the gate of the transistor M26 (or a node N14), and a bias voltage VBP applied to a gate thereof is provided as an option.

The output switch circuit 30 has at least the same function as the output switch circuit 30 described with reference to FIG. 7, and switches and outputs the output voltage Vout1 of the positive-polarity amplifier 10 and the output voltage Vout2 of the negative-polarity amplifier 20 to the driver output terminals P1 and P2 or P2 and P1, responsive to the control signals S1 and S2.

Referring to FIG. 2, in each of the positive-polarity amplifier 10 and the negative-polarity amplifier 20, a potential difference (VDD2−VDD1, or VDD1−VSS) between the voltage supplies in the output stage is set to a half of the potential difference (VDD2−VSS) between the voltage supplies of the differential unit.

Most of a consumption current of each amplifier flows to the output stage. Thus, by setting the potential difference between the voltage supplies in the output stage to a half of the potential difference between the voltage supplies of the differential unit, power consumption of each amplifier can be reduced to approximately a half as compared with a conventional art.

A case where each of the positive-polarity amplifier 10 and the negative-polarity amplifier 20 is composed of low-voltage transistors will be described. For simplifying the description, the description will be given in connection with an example where the high-potential voltage supply VDD2 is set to 8V, the intermediate-potential voltage supply VDD1 is set to 0V, and the low-potential voltage supply is set to −8V.

Referring to FIG. 2, among components of the positive-polarity amplifier 10 and the negative-polarity amplifier 20, the components each of which must be formed of 16V withstand voltage transistors are the differential unit 10A of the positive-polarity amplifier 10 and the differential unit 20A of the negative-polarity amplifier 20. Other transistors can be formed of 8V withstand voltage transistors. Components of the output switch circuit 30 must be formed of 16V withstand voltage transistors.

The output switch circuit 30 includes a precharge circuit 31. The precharge circuit 31 is provided as the circuit that prevents a voltage equal to or larger than a withstand voltage from being applied to low voltage devices when amplifier components except those of the differential units are formed of the low voltage devices (each with 8V withstand voltage). Activation of the precharge circuit 31 is controlled by a control signal S3. Immediately before switches SW11 and SW22 are turned on, the precharge circuit 31 precharges a voltage at the driver output terminal P1 to the intermediate-potential voltage supply VDD1 or higher, and precharges a voltage at the driver output terminal P2 to the intermediate-potential voltage supply VDD1 or lower.

Further, immediately before switches SW12 and SW21 are turned on, the precharge circuit 31 precharges a voltage at the driver output terminal P1 to the intermediate-potential voltage supply VDD1 or lower, and precharges a voltage at the driver output terminal P2 to the intermediate-potential voltage supply VDD1 or higher. When the low-voltage devices are not employed for each amplifier, the precharge circuit 31 does not need to be provided.

The transistors M31 and M41 are auxiliary transistors for preventing withstand voltage range deviation of the transistors M14, M16, M24, and M26 formed of the low-voltage devices (each with 8V withstand voltage) due to potential variations of the gate N13 and N14 in the amplifying transistors M16 and M26.

When a voltage at the node N13 becomes equal to or less than the intermediate-potential voltage supply VDD1, the auxiliary transistor M31 is turned on and controls a potential at the node N13 to be equal to or more than the voltage of the intermediate-potential voltage supply VDD1 by a charging operation. When the voltage at the node N13 changes between the high-potential voltage supply VDD2 and the intermediate-potential voltage supply VDD1, the auxiliary transistor M31 is turned off.

Likewise, the auxiliary transistor M41 is turned on when a voltage at the node N14 becomes equal to or larger than the intermediate-potential voltage supply VDD1, and controls a potential at the node N14 to be equal to or less than the intermediate-potential voltage supply VDD1 by a discharging operation.

By the configuration described above, the transistors that constitute each of the positive-polarity amplifier 10 and the negative-polarity amplifier 20 except the differential units 10A and 20A can be formed of the low-voltage devices, and area saving can be thereby achieved.

FIG. 3 is a diagram showing a second example of the positive-polarity amplifier 10, negative-polarity amplifier 20, and output switch circuit 30 in the DACs for two outputs in FIG. 1. Incidentally, same component numbers are given to same components that are the same as those in FIG. 2.

Referring to FIG. 3, only the differential unit 10A in the positive-polarity amplifier 10 is different from that in FIG. 2, and other components have the same configurations as those in FIG. 2. Only the differential unit 10A will be described below. The differential unit 10A includes n (n being an integer equal to or greater than one) N-channel differential pairs (M11-1, M12-1), (M11-2, M12-2), . . . , and (M11-$n$, M12-$n$) respectively driven by current sources M15-1, M15-2, . . . , and M15-$n$ with one terminals thereof connected to the low-potential voltage supply VSS, respectively. First outputs of output pairs of the n N-channel differential pairs are connected in common, and second outputs of the output pairs of the n N-channel differential pairs are connected in common. The output pairs are connected to the P-channel current mirror (M13, M14) that constitute a load circuit.

To gates of first terminals (M12-1, M12-2, . . . , and M12-$n$) that constitute non-inverting input terminals of input pairs of the respective differential pairs, n positive-polarity reference voltages V11, V12, . . . , and V1$n$ are input, respectively. Gates of second terminals (M11-1, M11-2, . . . , M11-$n$) that constitute inverting input terminals of the input pairs of the respective differential pairs are connected in common to the amplifier output terminal N11.

In the negative-polarity amplifier 20 as well, only the differential unit 20A is different from that in FIG. 2, and other components have the same configurations as those in FIG. 2. Only the differential unit 20A will be described below. The differential unit 20A includes n (the n being the integer equal to or greater than one) P-channel differential pairs (M21-1, M22-1), (M21-2, M22-2), ..., and (M21-n, M22-n) respectively driven by current sources M25-1, M25-2, ..., and M25-n with one terminals thereof connected to the high-potential voltage supply VDD2, respectively. First outputs of output pairs of the n P-channel differential pairs are connected in common, and second outputs of the output pairs of the n P-channel differential pairs are connected in common. The output pairs are connected to the N-channel current mirror (M23, M24) that constitute a load circuit.

To gates of first terminals (M22-1, M22-2, ..., and M22-n) that constitute non-inverting input terminals of input pairs of the respective differential pairs, n negative-polarity reference voltages V21, V22, ..., and V2n are input, respectively. Gates of second terminals (M21-1, M21-2, ..., M21-n) that constitute inverting input terminals of the input pairs of the respective differential pairs are connected in common to the amplifier output terminal N12.

The output voltage Vout1 of the positive-polarity amplifier 10 and the output voltage Vout2 of the negative-polarity amplifier 20 are expressed by the following expressions (1) and (2), respectively:

$$Vout1 = (V11 + V12 + \ldots V1n)/n \quad (1)$$

$$Vout2 = (V21 + V22 + \ldots + V2n)/n \quad (2)$$

According to Expression (1), the output voltage Vout1 becomes an average value of the n voltages V11 to V1n. According to Expression (2), the output voltage Vout2 becomes an average value of the n voltages V21 to V2n.

When the positive-polarity amplifier 10 and the negative-polarity amplifier 20 are configured as those in FIG. 3, the positive-polarity decoder 11 in FIG. 1 selects n voltages inclusive of voltages that may be identical from among positive-polarity reference voltages according to the input first video digital data and outputs the selected voltages as the voltages V11 to V1n. The negative-polarity decoder 21 selects n voltages inclusive of voltages that may be identical from among negative-polarity reference voltages according to the input second video digital data and outputs the selected voltages as the voltages V21 to V2n.

Since the output switch circuit 30 has the same configuration as that in FIG. 2, a description of the output switch circuit 30 will be omitted.

In each of the positive-polarity amplifier 10 and the negative-polarity amplifier 20 in FIG. 3, a potential difference between the voltage supplies in the output stage is set to a half of a potential difference between the voltage supplies in each of the differential unit 10A and the differential unit 20A.

With this arrangement, most of a consumption current of each of the positive-polarity amplifier 10 and the negative-polarity amplifier 20 flows to the output stage. Thus, power consumption can be also reduced to approximately a half of the conventional art.

Next, an area saving effect of the configuration shown in FIG. 3 will be described below.

Each of the positive-polarity amplifier 10 and the negative-polarity amplifier 20 in FIG. 3 includes the n differential pairs of the same polarity, and operates on the n reference voltages input to the differential pairs, respectively, thereby allowing generation of a great number of gray scale signal voltages using the small number of reference voltages. Thus, the respective circuit sizes of the reference voltage generation circuits 12 and 22 and the decoders 11 and 21 in FIG. 1 can be reduced, and area saving of the DACs can be promoted.

Assume that a plurality of differential pairs of the same polarity are provided. In the Rail to Rail amplifier including differential pairs of both of polarities of N-channel and P-channel, in particular, the area of a differential unit remarkably increases because a plurality of N-channel differential pairs and a plurality of P-channel differential pairs are provided.

On contrast therewith, in this example, each differential unit can be formed using the single polarity. Thus, an increase in the area of the differential unit can be prevented.

Further, among components of the positive-polarity amplifier 10 and the negative-polarity amplifier 20 in FIG. 3, transistors except those used in the differential units 10A and 20A can also be formed of low-voltage transistors, as in FIG. 2. Area saving can be thereby promoted.

When each of the positive-polarity amplifier 10 and the negative-polarity amplifier 20 is configured to include the low-voltage transistors, the output switch circuit 30 includes the precharge circuit 31, as in FIG. 2.

Further, in this example as well, in order to prevent withstand voltage range deviation of the transistors M14, M16, M24, and M26, the auxiliary transistors M31 and M41 may be included.

Since the respective operations of the auxiliary transistors M31 and M41 are the same as those in FIG. 2, a description of the operations will be omitted.

Figure 4:
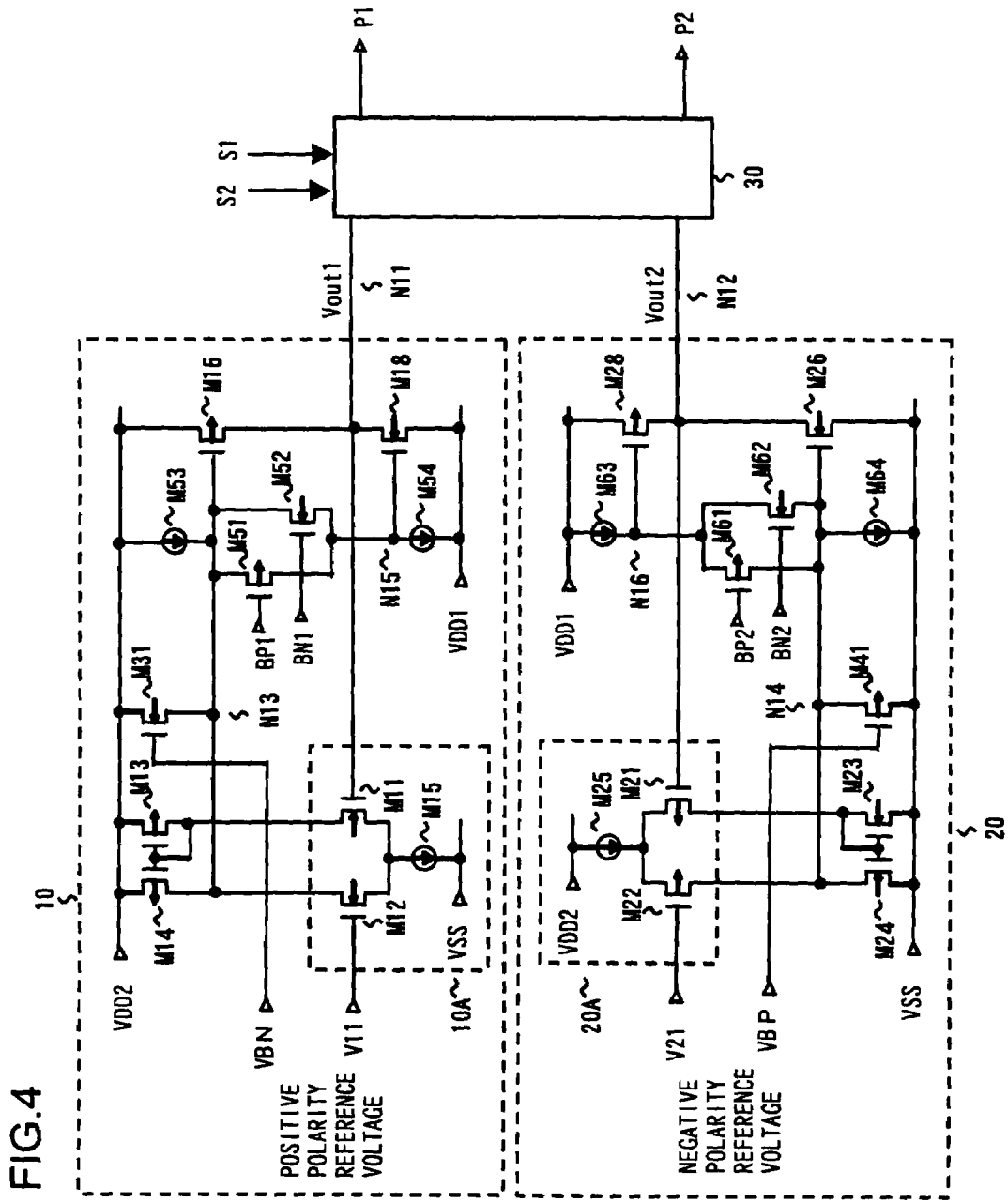
FIG. 4 is a diagram showing a configuration of a third example of the present invention.

FIG. 4 is a diagram showing a third example of the positive-polarity amplifier 10, negative-polarity amplifier 20, and output switch circuit 30 in the DACs for two outputs in FIG. 1. Referring to FIG. 4, same reference numerals are given to same components that are the same as those in FIG. 2.

Referring to FIG. 4, the positive-polarity amplifier 10 includes a differential input stage, an intermediate stage, and an output stage. The differential input stage of the positive-polarity amplifier 10 includes the current source M15 with the first terminal thereof connected to the low-potential voltage supply VSS, the differential unit 10A having the N-channel differential pair (M11, M12) with the common source thereof connected to the second terminal of the current source M15, and the P-channel current mirror (M13, M14) connected between the output pair of the N-channel differential pair (M11, M12) and the high-potential voltage supply VDD2. The positive-polarity reference voltage V11 is supplied to the non-inverting input terminal (gate of the transistor M12) of the input pair of the N-channel differential pair (M11, M12), and the inverting input terminal (gate of the transistor M11) is connected to the amplifier output terminal N11.

An amplification stage of the positive-polarity amplifier 10 includes the amplifying transistor M16 for a charging operation, connected between the high-potential voltage supply VDD2 and the amplifier output terminal N11, with the gate thereof connected to the output terminal (connection node between the transistors M12 and M14) of the P-channel current mirror (M13, M14), and an amplifying transistor M18 for a discharging operation, connected between the amplifier output terminal N11 and the intermediate voltage supply VDD1.

The intermediate stage of the positive-polarity amplifier 10 includes floating current sources M51 and M52 and current sources M53 and M54. The floating current source M51 is constituted from a P-channel transistor M51. A bias voltage BP1 is supplied to a gate of the P-channel transistor M51. A source of the P-channel transistor M51 is connected to the gate N13 of the amplifying transistor M16, and a drain of the P-channel transistor M51 is connected to a gate terminal N15 of the amplifying transistor M18. The floating current source M52 is constituted from an N-channel transistor M52. A bias voltage BN1 is supplied to a gate of the N-channel transistor M52. A drain of the N-channel transistor M52 is connected to the gate terminal N13 of the amplifying transistor M16, and a source of the N-channel transistor M52 is connected to the gate terminal N15 of the amplifying transistor M18.

The current source M53 is connected between the high-potential voltage supply VDD2 and the gate terminal N13 of the amplifying transistor M16. The current source M54 is connected between the intermediate voltage supply VDD1 and the gate terminal N15 of the amplifying transistor M18.

A sum of currents of the floating current sources M51 and M52 is set to be substantially equal to a current of each of the current sources M53 and M54.

The negative-polarity amplifier 20 includes a differential input stage, an intermediate stage, and an output stage. The differential input stage of the negative-polarity amplifier 20 includes the current source M25 with the first terminal thereof connected to the high-potential voltage supply VDD2, the differential unit 20A having the P-channel differential pair (M21, M22) with the common source thereof connected to the second terminal of the current source M25, and the N-channel current mirror (M23, M24) connected between the output pair of the P-channel differential pair (M21, M22) and the low-potential voltage supply VSS. The negative-polarity reference voltage V21 is supplied to the non-inverting input terminal (gate of the transistor M22) of the input pair of the P-channel differential pair (M21, M22), and the inverting input terminal (gate of the transistor M21) is connected to the amplifier output terminal N12.

An amplification stage of the negative-polarity amplifier 20 includes the amplifying transistor M26 for a discharging operation, connected between the low-potential voltage supply VSS and the amplifier output terminal N12, with the gate thereof connected to the input terminal (connection node between the transistors M22 and M24) of the N-channel current mirror (M23, M24), and an amplifying transistor M28 for a charging operation, connected between the amplifier output terminal N12 and the intermediate voltage supply VDD1.

The intermediate stage of the negative-polarity amplifier 20 includes floating current sources M61 and M62 and current sources M63 and M64. The floating current source M61 is constituted from a P-channel transistor M61. A bias voltage BP2 is applied to a gate of the P-channel transistor M61. A drain of the P-channel transistor M61 is connected to the gate terminal N14 of the amplifying transistor M26, and a source of the P-channel transistor M61 is connected to a gate terminal N16 of the amplifying transistor M28. The floating current source M62 is constituted from an N-channel transistor M62. A bias voltage BN2 is applied to a gate of the N-channel transistor M62. A source of the N-channel transistor M62 is connected to the gate terminal N14 of the amplifying transistor M26, and a drain of the P-channel transistor M62 is connected to the gate terminal N16 of the amplifying transistor M28.

The current source M63 is connected between the intermediate-potential voltage supply VDD1 and the gate terminal N16 of the amplifying transistor M28. The current source M64 is connected between the low voltage supply VSS and the gate terminal N14 of the amplifying transistor M26.

A sum of currents of the floating current sources M61 and M62 is set to be substantially equal to a current of each of the current sources M63 and M64.

Figure 8:
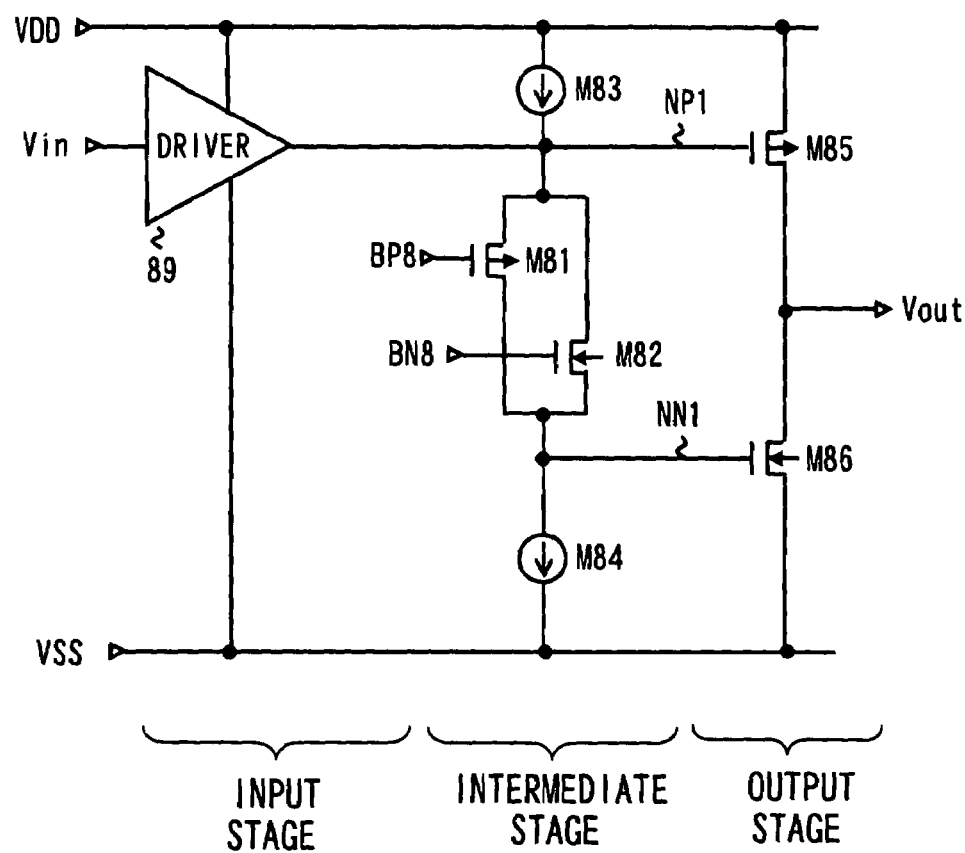
FIG. 8 is a diagram showing a configuration of an AB class output circuit in Patent Document 1.

Each of the positive-polarity amplifier 10 and the negative-polarity amplifier 20 in FIG. 4 is an application of an AB class output circuit in FIG. 8, and a driver 89 in FIG. 8 is replaced with the differential unit and the current mirror.

A potential difference between the source voltages of each of the intermediate stage and the output stage of each of the positive-polarity amplifier 10 and the negative-polarity amplifier 20 is set to a half of a potential difference between the source voltages of each of the differential unit 10A and the differential unit 20A.

Since most of a consumption current of each of the positive-polarity amplifier 10 and the negative-polarity amplifier 20 flows to the output stage, power consumption can be also reduced to approximately a half of the conventional art.

Each of the positive-polarity amplifier 10 and the negative-polarity amplifier 20 in FIG. 4 has features (refer to paragraphs [0021] and [0022]) of high-speed charging and discharging operations of the AB class output circuit in FIG. 8.

Further, among components of the positive-polarity amplifier 10 and the negative-polarity amplifier 20 in FIG. 4, transistors except those used in the differential units 10A and 20A can also be formed of low-voltage transistors, as in FIG. 2. Area saving can be thereby promoted.

When each of the positive-polarity amplifier 10 and the negative-polarity amplifier 20 is configured to include the low-voltage transistors, the output switch circuit 30 includes the precharge circuit 31, as in FIG. 2.

Further, in order to prevent breakdown range deviation of the transistors M14, M16, M24, and M26, the auxiliary transistors M31 and M41 may be included. Since the operations of the auxiliary transistors M31 and M41 are the same as those in FIG. 2, a description of the operations will be omitted.

The respective examples of the positive-polarity amplifier 10, negative-polarity amplifier 20, and output switch circuit 30 suitable for the DACs for two outputs in FIG. 1 were shown above with reference to FIGS. 2 through 4. An amplifier where the respective configurations in FIGS. 2 through 4 are combined as necessary can be of course employed. The positive-polarity amplifier 10 in FIG. 3, for example, may include the intermediate stage (M51, M52, M53, and M54) of FIG. 4, and the negative-polarity amplifier 20 in FIG. 3 may include the intermediate stage (M61, M62, M63, and M64) of FIG. 4.

Figure 5:
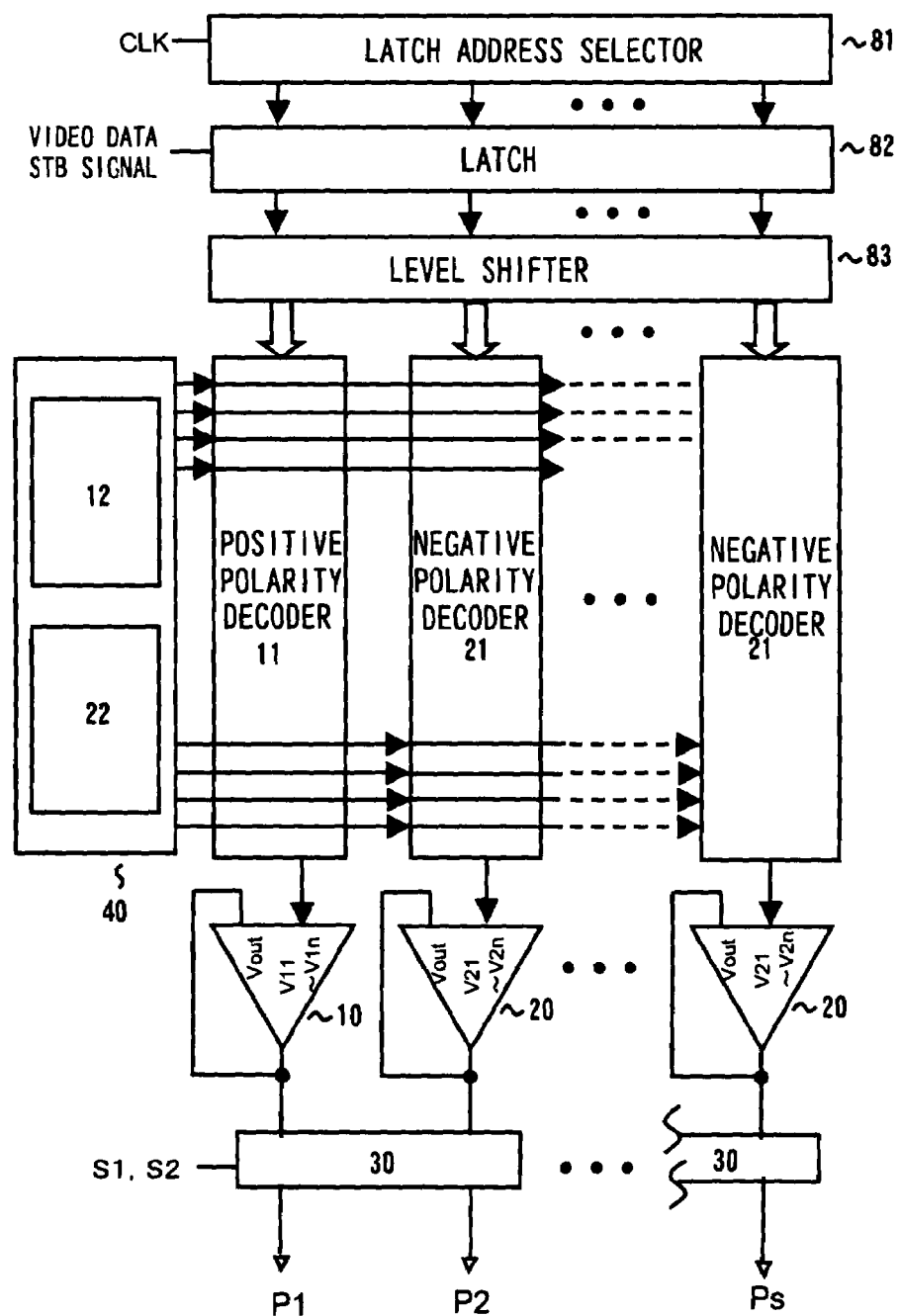
FIG. 5 is a diagram showing a configuration of a fourth example of the present invention.

FIG. 5 is a diagram showing a configuration of a data driver for dot inversion driving that includes the DACs or amplifiers in FIGS. 1 to 4. FIG. 5 shows a main portion of the data driver in a block diagram.

Referring to FIG. 5, this data driver includes a latch address selector 81, a latch 82, a level shifter 83, a reference voltage generation circuit 40, the positive-polarity decoders 11, the negative-polarity decoders 21, the positive-polarity amplifiers 10, the negative-polarity amplifiers 20, and the output switch circuits 30.

The latch address selector 81 determines a data latch timing based on a clock signal CLK. The latch 82 latches digital video data based on the timing determined by the latch address selector 81, and outputs data in unison to the decoders (positive-polarity decoders 11 and negative-polarity decoders 21) responsive to an STB signal (strobe signal). Each of the latch address selector 81 and the latch 82 is a logic circuit and generally constructed of a low-voltage (0V to 3.3V) circuit.

The reference voltage generation circuit 40 includes the positive-polarity reference voltage generation circuit 12 and the negative-polarity reference voltage generation circuit 22. To each of the positive-polarity decoders 11, reference voltages from the positive-polarity reference voltage generation circuit 12 are supplied. The positive-polarity decoder 11 selects n (n being an integer equal to or greater than one) reference voltages inclusive of reference voltages that may be identical, corresponding to input data, and outputs the selected reference voltages as the positive-polarity reference voltages V11 to V1n. To each of the negative-polarity decoders 21, reference voltages from the negative-polarity reference voltage generation circuit 22 are supplied. The negative-polarity decoder 21 selects n (the n being the integer equal to or greater than one) reference voltages inclusive of reference voltages that may be identical, corresponding to another input data, and outputs the selected reference voltages as the negative-polarity reference voltages V21 to V2n. Each positive-polarity amplifier 10 receives the n reference voltages output from the positive-polarity decoder 11, and each negative-polarity amplifier 20 receives the n reference voltages output from the negative-polarity decoder 21. Each of the positive-polarity amplifier 10 and the negative-polarity amplifier 20 performs operational amplification, thereby supplying an output voltage to a corresponding one of the output switch circuits 30. The output switch circuits 30 are provided for every two of the even number of driver output terminals P1, P2, ..., and Ps, and switches and outputs the output voltages of the positive-polarity amplifier 10 and the negative-polarity amplifier 20 to the every two of the driver output terminals responsive to the control signals S1 and S2.

The data driver in FIG. 5 has the features and effects described with reference to FIGS. 1 to 4. Lower power consumption and area saving (cost reduction) can be implemented. When the data driver in FIG. 5 is employed for a data driver 980 in a liquid crystal display device in FIG. 6, lower power consumption and cost reduction of the liquid crystal display device can be implemented.

The above description was given in connection with the examples described above. The present invention is not limited to the configurations of the examples described above, and of course includes various variations and modifications that could be made by those skilled in the art within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A data driver comprising:
a positive-polarity amplifier including: a first input stage that receives at least one voltage selected from among a plurality of positive-polarity reference voltages; and a first output stage that receives an output of said first input stage, performs amplification, and outputs a voltage to a first amplifier output terminal;
a negative-polarity amplifier including: a second input stage that receives at least one voltage selected from among a plurality of negative-polarity reference voltages; and a second output stage that receives an output of said second input stage, performs amplification, and outputs a voltage to a second amplifier output terminal; and
an output switch circuit that performs switching between straight connection of said first and second amplifier output terminals to first and second driver output terminals, respectively and cross connection of said first and second amplifier output terminals to said second and first driver output terminals, respectively, responsive to a control signal;
said data driver being supplied with a plurality of voltage supplies including a high-potential voltage supply, a low-potential voltage supply, and an intermediate-potential voltage supply having a potential intermediate between the high-potential voltage supply and the low-potential voltage supply;
wherein the high-potential voltage supply and the low-potential voltage supply are provided to said first input stage in said positive-polarity amplifier;
the high-potential voltage supply and the intermediate-potential voltage supply are provided to said first output stage in said positive-polarity amplifier;
the high-potential voltage supply and the low-potential voltage supply are provided to said second input stage in said negative-polarity amplifier; and
the intermediate-potential voltage supply and the low-potential voltage supply are provided to said second output stage in said negative-polarity amplifier.

2. The data driver according to claim 1, wherein said output switch circuit includes a precharge circuit that precharges said first and second driver output terminals to predetermined voltages, respectively.

3. The data driver according to claim 2, wherein
immediately before said first and second amplifier output terminals are straightly connected to said first and second output terminals, respectively, said precharge circuit precharges said first driver output terminal to the intermediate-potential voltage supply or higher and precharges said second driver output terminal to the voltage of the intermediate-potential voltage supply or lower; and
immediately before said first and second amplifier output terminals are cross-connected to said second and first driver output terminals, respectively, said precharge circuit precharges said second driver output terminal to the intermediate-potential voltage supply or higher and precharges said first driver output terminal to the voltage of the intermediate-potential voltage supply or lower.

4. The data driver according to claim 1, wherein said output switch circuit comprises:
first and second switches with first terminals thereof connected in common to said first amplifier output terminal and second terminals thereof connected to said first and second driver output terminals, respectively;
third and fourth switches with first terminals thereof connected in common to said second amplifier output terminal and second terminals thereof connected to said first and second driver output terminals, respectively; and
a precharge circuit that precharges said first and second driver output terminals to predetermined voltages, respectively; wherein
said precharge circuit precharges said first driver output terminal to the intermediate-potential voltage supply or higher and precharges said second driver output terminal to the voltage of the intermediate-potential voltage supply or lower immediately before said first and fourth switches are turned on; and
said precharge circuit precharges said second driver output terminal to the voltage of the intermediate-potential voltage supply or higher and precharges said first driver output terminal to the voltage of the intermediate-potential voltage supply or lower immediately before said second and third switches are turned on.

5. A display device including the data driver as set forth in claim 1.

6. The display device according to claim 5, wherein the intermediate-potential voltage supply is set to a voltage close to a common voltage VCOM of a display panel.

7. A data driver comprising:
a positive-polarity reference voltage generation circuit that outputs a plurality of positive-polarity reference voltages having mutually different potentials;
a positive-polarity decoder that selects and outputs at least one reference voltage in accordance with an input first digital signal from among the positive-polarity reference voltages;
a positive-polarity amplifier including: a first differential unit that receives at least one reference voltage selected by said positive-polarity decoder; and a first output stage that receives an output of said first differential unit, performs amplification, and outputs a voltage to a first amplifier output terminal;
a negative-polarity reference voltage generation circuit that outputs a plurality of negative-polarity reference voltages having mutually different potentials;
a negative-polarity decoder that selects and outputs at least one reference voltage in accordance with an input second digital signal from among the negative-polarity reference voltages;
a negative-polarity amplifier including: a second differential unit that receives at least one reference voltage selected by said negative-polarity decoder; and a second output stage that receives an output of said second differential unit, performs amplification, and outputs a voltage to a second amplifier output terminal; and
an output switch circuit that performs switching between straight connection of said first and second amplifier output terminals to first and second driver output terminals, respectively and cross connection of said first and second amplifier output terminals to said second and first driver output terminals, respectively, responsive to a control signal;
said data driver being supplied with voltage supplies including a high-potential voltage supply, a low-potential voltage supply, and an intermediate-potential voltage supply having a potential intermediate between the high-potential voltage supply and the low-potential voltage supply;
wherein the high-potential voltage supply and the low-potential voltage supply are provided to said first differential unit in said positive-polarity amplifier;
the high-potential voltage supply and the intermediate-potential voltage supply are provided to said at least first output stage, excluding said first differential unit in said positive-polarity amplifier;
the high-potential voltage supply and the low-potential voltage supply are provided to said second differential unit in said negative-polarity amplifier; and
the intermediate-potential voltage supply and the low-potential voltage supply are provided to said at least second output stage, excluding said second differential unit in said negative-polarity amplifier.

8. The data driver according to claim 7, wherein the reference voltage between the high-potential voltage supply and the intermediate-potential voltage supply, selected by said positive-polarity decoder, is supplied to said first differential unit of said positive-polarity amplifier; and
the reference voltage between the low-potential voltage supply and the intermediate-potential voltage supply, selected by said negative-polarity decoder, is supplied to said second differential unit of said negative-polarity amplifier.

9. The data driver according to claim 7, wherein said positive-polarity decoder is driven by the high-potential voltage supply and the intermediate-potential voltage supply; and
said negative-polarity decoder is driven by the intermediate-potential voltage supply and the low-potential voltage supply.

10. The data driver according to claim 7, wherein
said first differential unit in said positive-polarity amplifier comprises:
a first current source connected to the low-potential voltage supply;
a first differential pair of a first conductivity type that receives the reference voltage selected by said positive-polarity decoder at a non-inverting input terminal thereof, said first differential pair being driven by a current from said first current source; and
a first load circuit connected between an output pair of said first differential pair and the high-potential voltage supply; wherein
said first output stage in said positive-polarity amplifier comprises:
a first charging transistor connected between the high-potential voltage supply and said first amplifier output terminal, a control terminal of said first charging transistor being connected to one of connection nodes between said output pair of said first differential pair and said first load circuit; and
a first discharging transistor connected between said first amplifier output terminal and the intermediate-potential voltage supply;
an inverting input terminal of said first differential pair being connected to said first amplifier output terminal; wherein
said second differential pair in said negative-polarity amplifier comprises:
a second current source connected to the high-potential voltage supply;
a second differential pair of a second conductivity type that receives the reference voltage selected by said negative-polarity decoder at a non-inverting input terminal thereof, said second differential pair being driven by a current from said second current source; and
a second load circuit connected between an output pair of said second differential pair and the low-potential voltage supply; and wherein
said second output stage in said negative-polarity amplifier comprises:
a second discharging transistor connected between the low-potential voltage supply and said second amplifier output terminal, a control terminal of said second discharging transistor being connected to one of connection nodes between said output pair of said second differential pair and said second load circuit; and
a second charging transistor connected between said second amplifier output terminal and the intermediate-potential voltage supply;
an inverting input terminal of said second differential pair being connected to said second amplifier output terminal.

11. The data driver according to claim 10, comprising:
a first auxiliary transistor connected between said control terminal of said first charging transistor and the high-potential voltage supply, said first auxiliary transistor being biased by a first bias voltage; and
a second auxiliary transistor connected between said control terminal of said second discharging transistor and the low-potential voltage supply, said second auxiliary transistor being biased by a second bias voltage.

12. The data driver according to claim 7, wherein
said first differential unit in said positive-polarity amplifier comprises:
first current sources comprising a plurality of current sources, connected to the low-potential voltage supply;
first differential pairs comprising a plurality of differential pairs of a first conductivity type that receive reference voltages selected by said positive-polarity decoder at non-inverting input terminals thereof, respectively, said first differential pairs being driven by currents from said first current sources, respectively; and
a first load circuit connected between output pairs of said first differential pairs connected in common and the high-potential voltage supply; wherein
said first output stage in said positive-polarity amplifier comprises:
a first charging transistor connected between the high-potential voltage supply and said first amplifier output terminal, a control terminal of said first charging transistor being connected to one of connection nodes between said output pairs of said first differential pairs connected in common and said first load circuit; and
a first discharging transistor connected between said first amplifier output terminal and the intermediate-potential voltage supply;
non-inverting input terminals of said first differential pairs being connected in common to said first amplifier output terminal; wherein
said second differential unit in said negative-polarity amplifier comprises:
second current sources comprising a plurality of current sources, connected to the high-potential voltage supply;
second differential pairs comprising a plurality of differential pairs of a second conductivity type that receive reference voltages selected by said negative-polarity decoder at non-inverting input terminals thereof, said second differential pairs being driven by currents from said second current sources, respectively; and
a second load circuit connected between output pairs of said second differential pairs connected in common and the low-potential voltage supply; and wherein
said second output stage in said negative-polarity amplifier comprises:
a second discharging transistor connected between the low-potential voltage supply and said second amplifier output terminal, a control terminal of said second discharging transistor being connected to one of connection nodes between said output pairs of said second differential pairs connected in common and said second load circuit; and
a second charging transistor connected between said second amplifier output terminal and the intermediate-potential voltage supply;
non-inverting input terminals of said second differential pairs being connected in common to said second amplifier output terminal.

13. The data driver according to claim 12, wherein
said positive-polarity amplifier further comprises a first intermediate output stage including:
a third current source connected between said control terminal of said first charging transistor and the high-potential voltage supply;
a fourth current source connected between a control terminal of said first discharging transistor and the intermediate-potential voltage supply; and
a first floating current source transistor of a first conductivity type and a second floating current source transistor of a second conductivity type both connected between said control terminal of said first charging transistor and said control terminal of said discharging transistor, each of said first and second floating current source transistors receiving a bias voltage at a control terminal thereof; and wherein
said negative-polarity amplifier further comprises a second intermediate stage including:
a fifth current source connected between said control terminal of said second discharging transistor and the low-potential voltage supply;
a sixth current source connected between a control terminal of said second charging transistor and the intermediate-potential voltage supply; and
a third floating current source transistor of a first conductivity type and a fourth floating current source transistor of a second conductivity type both connected between said control terminal of said second charging transistor and said control terminal of said second discharging transistor, each of said third and fourth floating current source transistors receiving a bias voltage at a control terminal thereof.

14. The data driver according to claim 7, wherein
said first differential unit in said positive-polarity amplifier comprises:
a first current source connected to the low-potential voltage supply;
a first differential pair of a first conductivity type that receives the reference voltage selected by said positive-polarity decoder at a non-inverting input terminal thereof, said first differential pair being driven by a current from said first current source; and
a first load circuit connected between an output pair of said first differential pair and the high-potential voltage supply; wherein
said first output stage in said positive-polarity amplifier comprises:
a first charging transistor connected between the high-potential voltage supply and said first amplifier output terminal, a control terminal of said first charging transistor being connected to one of connection nodes between said output pair of said first differential pair and said first load circuit; and
a first discharging transistor connected between said first amplifier output terminal and the intermediate-potential voltage supply;
an inverting input terminal of said first differential pair being connected to said first amplifier output terminal;
said positive-polarity amplifier further comprising a first intermediate stage including:
a third current source connected between said control terminal of said first charging transistor and the high-potential voltage supply;
a fourth current source connected between a control terminal of said first discharging transistor and the intermediate-potential voltage supply; and
a first floating current source transistor of a first conductivity type and a second floating current source transistor of a second conductivity type both connected between said control terminal of said first charging transistor and said control terminal of said discharging transistor, each of said first and second floating current source transistors receiving a bias voltage at a control terminal thereof; wherein
said second differential pair in said negative-polarity amplifier comprises:

a second current source connected to the high-potential voltage supply;

a second differential pair of a second conductivity type that receives the reference voltage selected by said negative-polarity decoder at a non-inverting input terminal thereof, said second differential pair being driven by a current from said second current source; and a second load circuit connected between an output pair of said second differential pair and the low-potential voltage supply; and wherein said second output stage in said negative-polarity amplifier comprises:

a second discharging transistor connected between the low-potential voltage supply and said second amplifier output terminal, a control terminal of said second discharging transistor being connected to one of connection nodes between said output pair of said second differential pair and said second load circuit; and a second charging transistor connected between said second amplifier output terminal and the intermediate-potential voltage supply;

an inverting input terminal of said second differential pair being connected to said second amplifier output terminal;

said negative-polarity amplifier further comprising a second intermediate stage including:

a fifth current source connected between said control terminal of said second discharging transistor and the low-potential voltage supply;

a sixth current source connected between a control terminal of said second charging transistor and the intermediate-potential voltage supply; and a third floating current source transistor of a first conductivity type and a fourth floating current source transistor of a second conductivity type both connected between said control terminal of said second charging transistor and said control terminal of said second discharging transistor, each of said third and fourth floating current source transistors receiving a bias voltage at a control terminal thereof.

15. A digital-to-analog converter circuit comprising:

a first digital-to-analog converter unit that performs conversion to produce a first analog voltage corresponding to an input first digital signal and outputs the first analog voltage to a first terminal thereof; and a second digital-to-analog converter unit that performs conversion to produce a second analog voltage corresponding to an input second digital signal and outputs the second analog voltage to a second terminal thereof;

said first digital-to-analog converter unit comprising:

a positive-polarity decoder that selects and outputs at least one positive-polarity reference voltage corresponding to the first digital signal from among a plurality of positive-polarity reference voltages output from a positive-polarity reference voltage generation circuit; and a positive-polarity amplifier including a first differential unit that receives at least one positive-polarity reference voltage selected by said positive-polarity decoder and a first output stage that receives an output of said first differential unit, performs amplification, and outputs the voltage to said first terminal;

said second digital-to-analog converter unit comprising:

a negative-polarity decoder that selects and outputs at least one negative-polarity reference voltage corresponding to the second digital signal from among a plurality of negative-polarity reference voltages output from a negative-polarity reference voltage generation circuit; and a negative-polarity amplifier including a second differential unit that receives at least one negative-polarity reference voltage selected by said negative-polarity decoder, and a second output stage that receives an output of said second differential unit, performs amplification, and outputs the voltage to said second terminal;

said digital-to-analog converter circuit further comprising:

an output switch circuit that performs switching between straight connection of said first terminal of said first digital-to-analog converter unit and said second terminal of said second digital-to-analog converter unit to said first output terminal and said second output terminal, respectively and cross connection of said second terminal of said second digital-to-analog converter unit and said first terminal of said first digital-to-analog converter unit to said first output terminal and said second output terminal, respectively;

said digital-to-analog converter circuit being provided with voltage supplies including a high-potential voltage supply, a low-potential voltage supply, an intermediate-potential voltage supply having a potential between the high-potential voltage supply and the low-potential voltage supply being supplied as a voltage supply; wherein the high-potential voltage supply and the low-potential voltage supply are provided to said first differential unit of said positive-polarity amplifier;

the high-potential voltage supply and the intermediate-potential voltage supply are provided to said at least first output stage excluding said first differential unit;

the high-potential voltage supply and the low-potential voltage supply are provided to said second differential unit of said negative-polarity amplifier; and the low-potential voltage supply and the intermediate-potential voltage supply are provided to said at least second output stage excluding said second differential unit.

* * * * *